US012057449B2

(12) United States Patent
Chen et al.

(10) Patent No.: US 12,057,449 B2
(45) Date of Patent: Aug. 6, 2024

(54) ISOLATION STRUCTURES FOR SEMICONDUCTOR DEVICES

(71) Applicant: Taiwan Semiconductor Manufacturing Co., Ltd., Hsinchu (TW)

(72) Inventors: Chao-Shuo Chen, Hsinchu (TW); Chia-Der Chang, Hsinchu (TW); Yi-Jing Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/816,044

(22) Filed: Jul. 29, 2022

(65) Prior Publication Data

US 2022/0367456 A1 Nov. 17, 2022

Related U.S. Application Data

(62) Division of application No. 16/937,297, filed on Jul. 23, 2020, now Pat. No. 11,521,969.

(Continued)

(51) Int. Cl.
*H01L 27/088* (2006.01)
*H01L 21/311* (2006.01)
(Continued)

(52) U.S. Cl.
CPC .. *H01L 27/0886* (2013.01); *H01L 21/823431* (2013.01); *H01L 21/823481* (2013.01);
(Continued)

(58) Field of Classification Search
CPC ............. H01L 27/0886; H01L 27/0928; H01L 21/823431; H01L 21/823481; H01L 21/31116; H01L 21/32135; H01L 27/0924
See application file for complete search history.

(56) References Cited

U.S. PATENT DOCUMENTS 9,093,530 B2  7/2015  Huang et al.
9,171,929 B2  10/2015  Lee et al.
(Continued)

FOREIGN PATENT DOCUMENTS

CN   107785430 A   3/2018
CN   109037202 A   12/2018
(Continued)

*Primary Examiner* — Christine A Enad
(74) *Attorney, Agent, or Firm* — Sterne, Kessler, Goldstein & Fox P.L.L.C.

(57) ABSTRACT

A semiconductor device with an isolation structure and a method of fabricating the same are disclosed. The semiconductor device includes first and second fin structures disposed on a substrate and first and second pairs of gate structures disposed on the first and second fin structures. The first end surfaces of the first pair of gate structures face second end surfaces of the second pair of gate structure. The first and second end surfaces of the first and second pair of gate structures are in physical contact with first and second sidewalls of the isolation structure, respectively. The semiconductor device further includes an isolation structure interposed between the first and second pairs of gate structures. An aspect ratio of the isolation structure is smaller than a combined aspect ratio of the first pair of gate structures.

20 Claims, 15 Drawing Sheets

Related U.S. Application Data

(60) Provisional application No. 62/967,270, filed on Jan. 29, 2020.

(51) Int. Cl.
  *H01L 21/3213* (2006.01)
  *H01L 21/8234* (2006.01)
  *H01L 27/092* (2006.01)

(52) U.S. Cl.
  CPC ..... *H01L 27/0924* (2013.01); *H01L 21/31116* (2013.01); *H01L 21/32135* (2013.01); *H01L 27/0928* (2013.01)

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,876,013 B1 | 1/2018 | Park et al. |
| 10,373,877 B1 | 8/2019 | Wang |
| 2016/0233094 A1 | 8/2016 | Anderson et al. |
| 2018/0047634 A1 | 2/2018 | Jun et al. |
| 2018/0138092 A1 | 5/2018 | Lee et al. |
| 2018/0190652 A1 | 7/2018 | Ching et al. |
| 2018/0315831 A1 | 11/2018 | Li et al. |
| 2018/0358346 A1 | 12/2018 | Kim et al. |
| 2019/0067120 A1 | 2/2019 | Ching et al. |
| 2019/0164839 A1* | 5/2019 | Tsai .......... H01L 27/0886 |
| 2019/0165155 A1 | 5/2019 | Chang et al. |
| 2019/0221431 A1 | 7/2019 | Hsieh et al. |
| 2019/0221653 A1 | 7/2019 | Hsiao et al. |
| 2019/0244865 A1 | 8/2019 | Xu et al. |
| 2019/0252268 A1 | 8/2019 | Xie |
| 2019/0305099 A1 | 10/2019 | Jo et al. |
| 2019/0312034 A1 | 10/2019 | Lee et al. |
| 2019/0378903 A1 | 12/2019 | Jeon |
| 2019/0386002 A1 | 12/2019 | Wu |
| 2019/0393324 A1* | 12/2019 | Chen .......... H01L 21/76897 |
| 2020/0006075 A1 | 1/2020 | Wang |
| 2020/0006334 A1 | 1/2020 | Hsueh et al. |
| 2020/0006354 A1 | 1/2020 | Wen et al. |
| 2020/0135574 A1 | 4/2020 | Yang |
| 2020/0161190 A1* | 5/2020 | Zang .......... H01L 27/0924 |
| 2020/0388699 A1 | 12/2020 | Wang |
| 2021/0249309 A1 | 8/2021 | Wu |

FOREIGN PATENT DOCUMENTS

| | | |
|---|---|---|
| KR | 20180053803 A | 5/2018 |
| KR | 20190064389 A | 6/2019 |
| TW | 201806166 A | 2/2018 |
| TW | 201837995 A | 10/2018 |
| TW | 201843716 A | 12/2018 |
| TW | 201944535 A | 11/2019 |

* cited by examiner

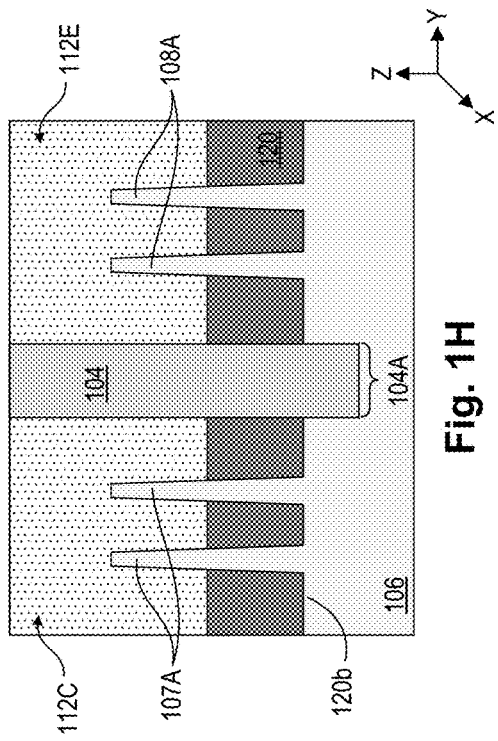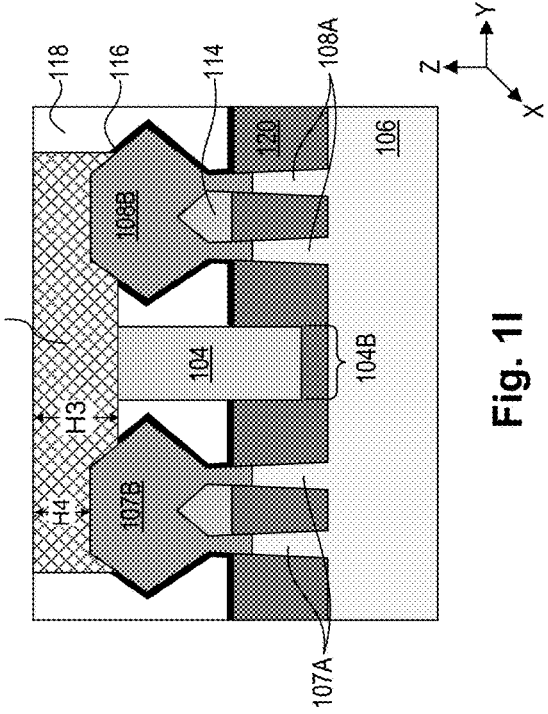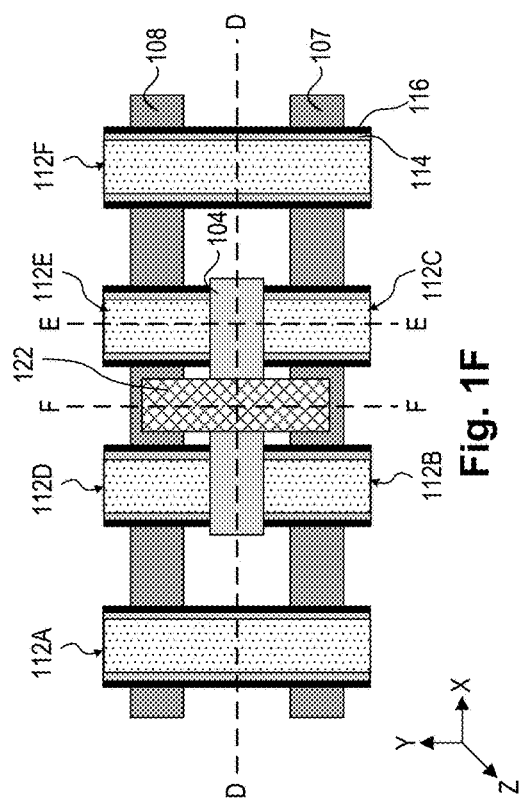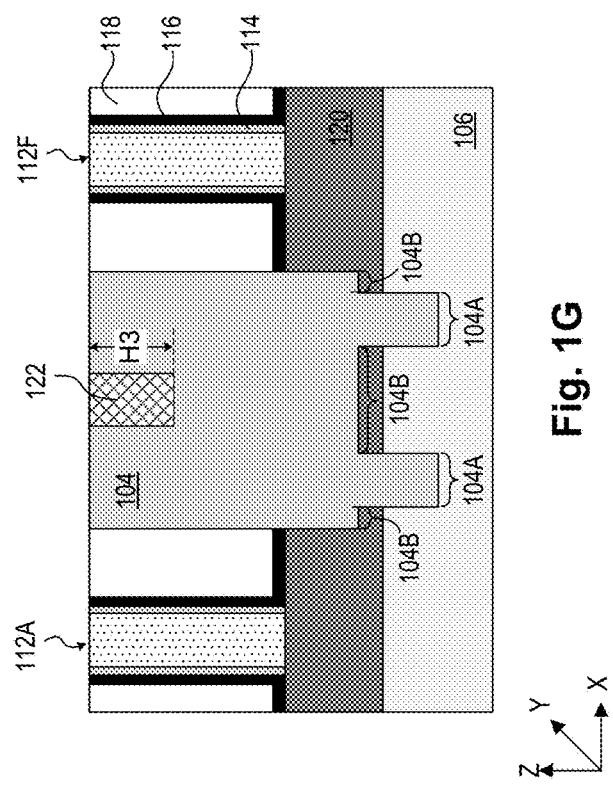

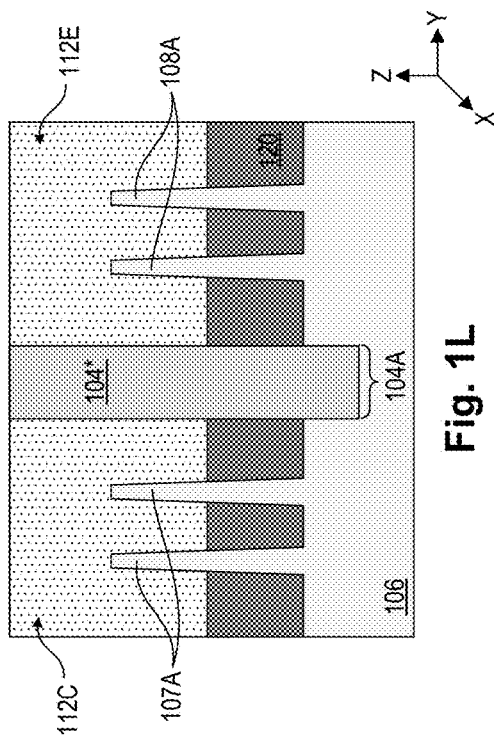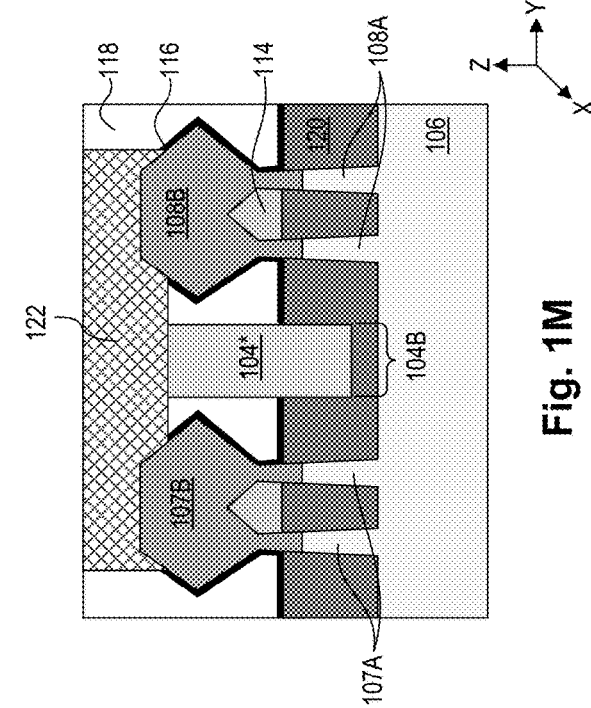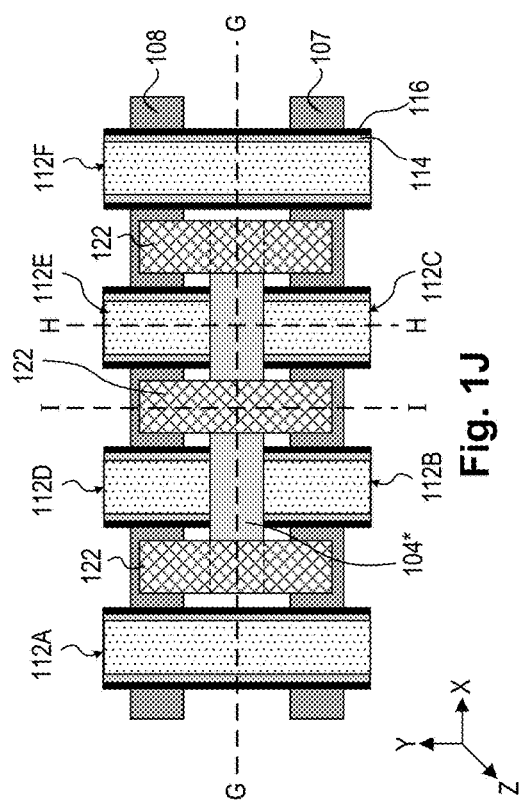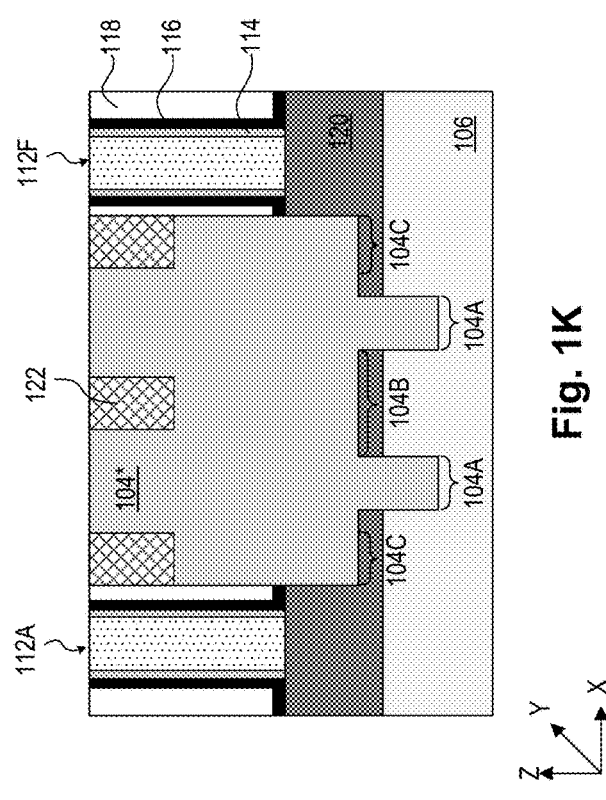

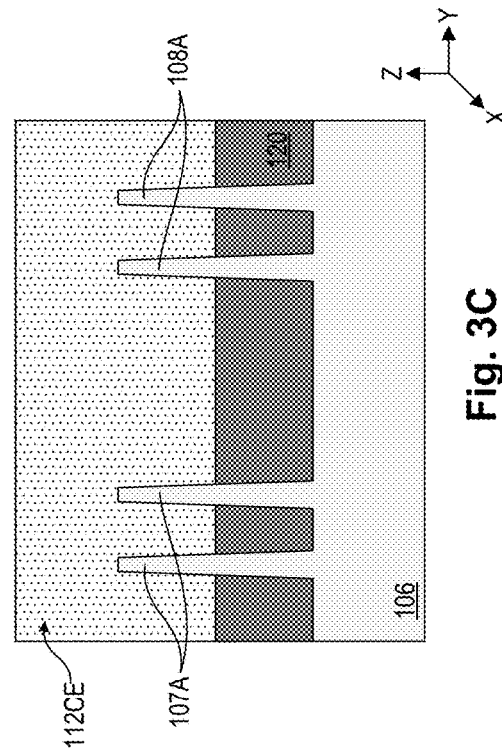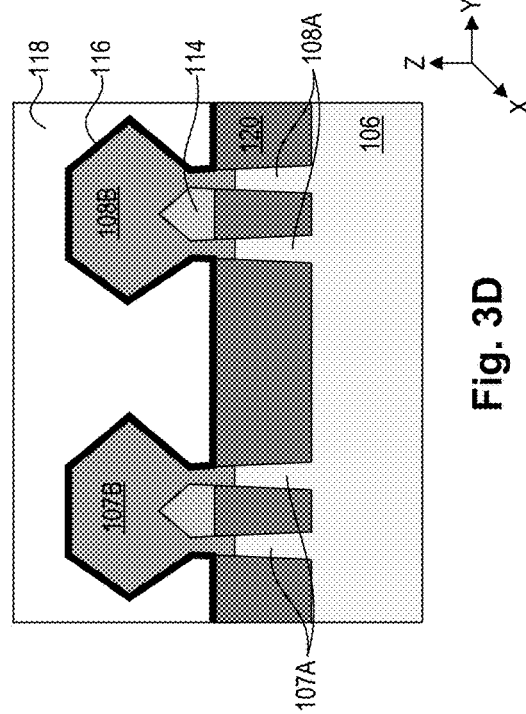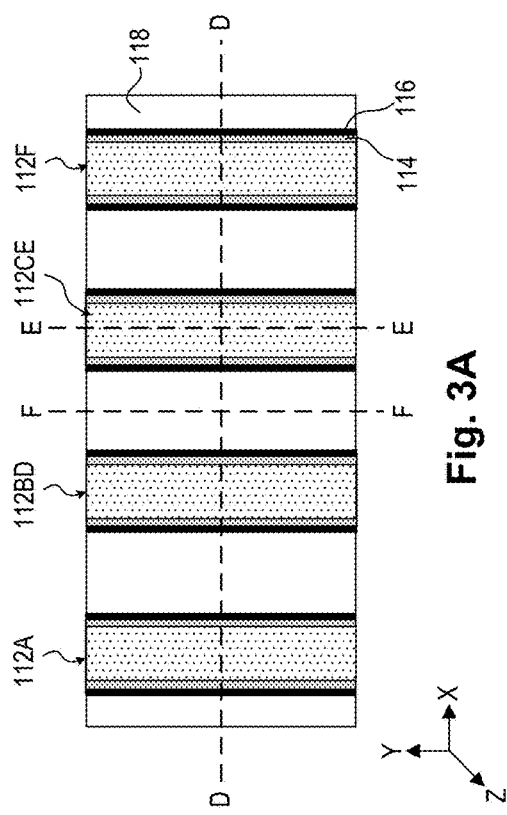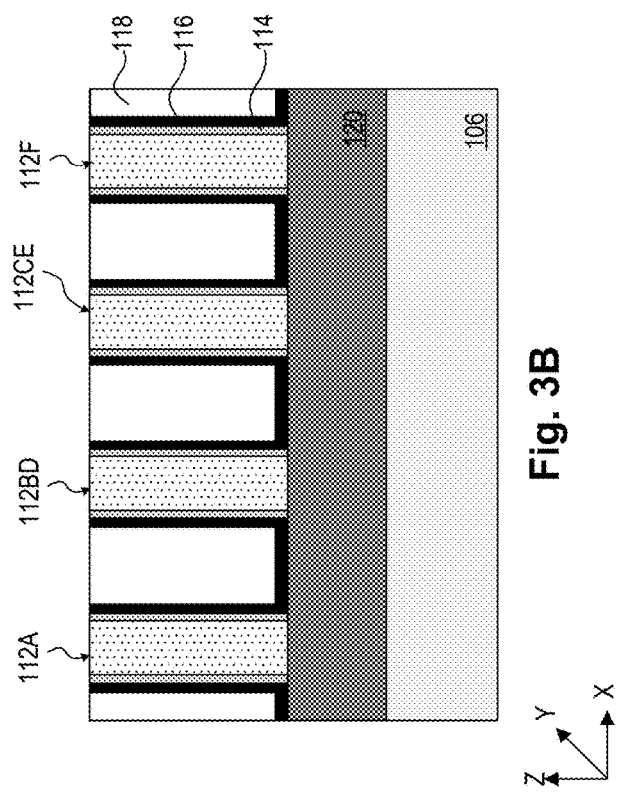

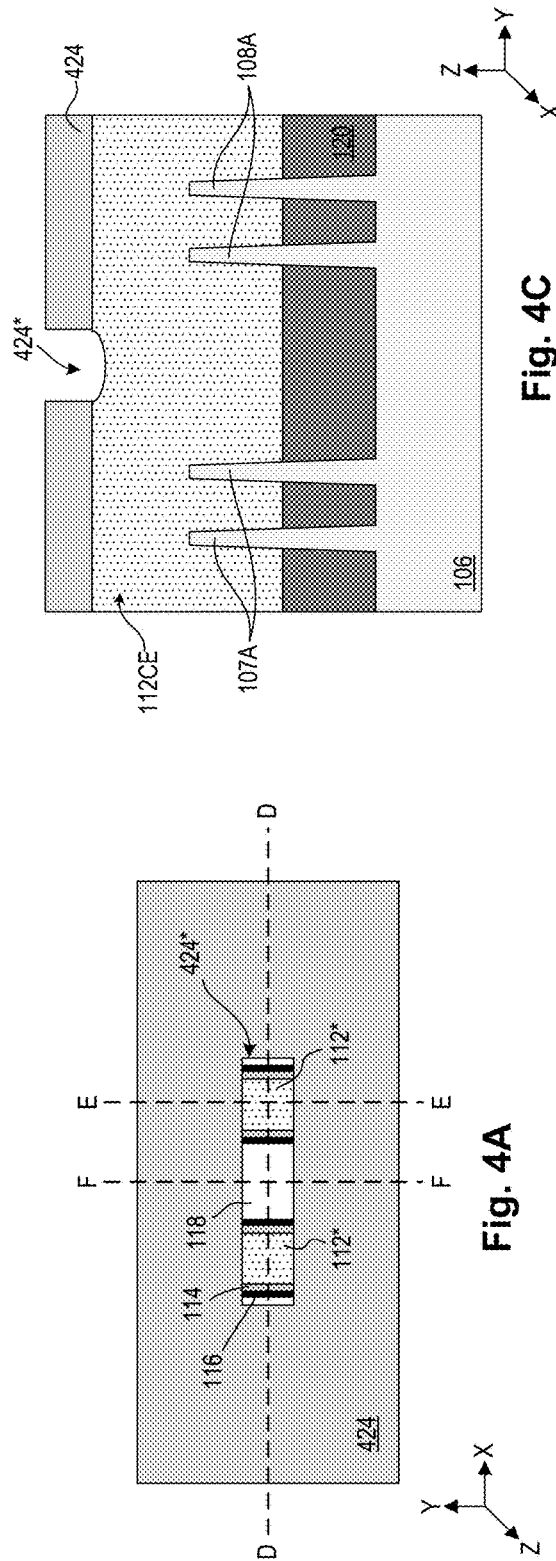
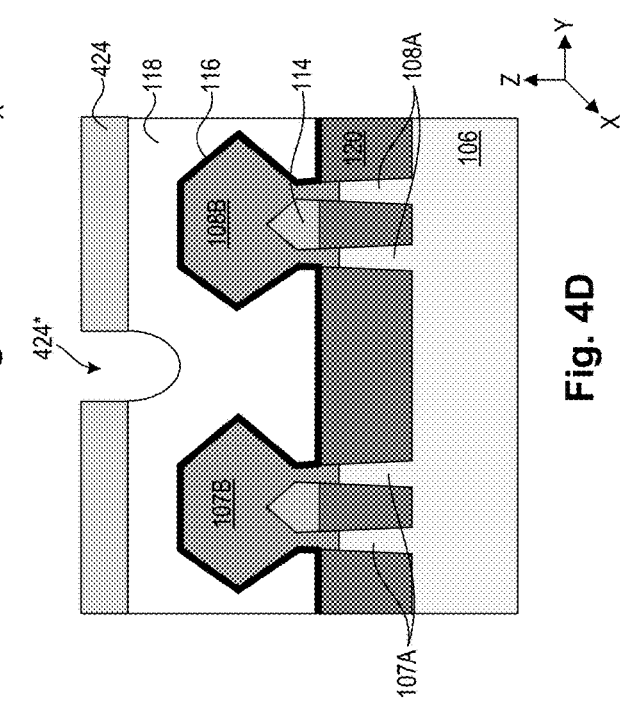
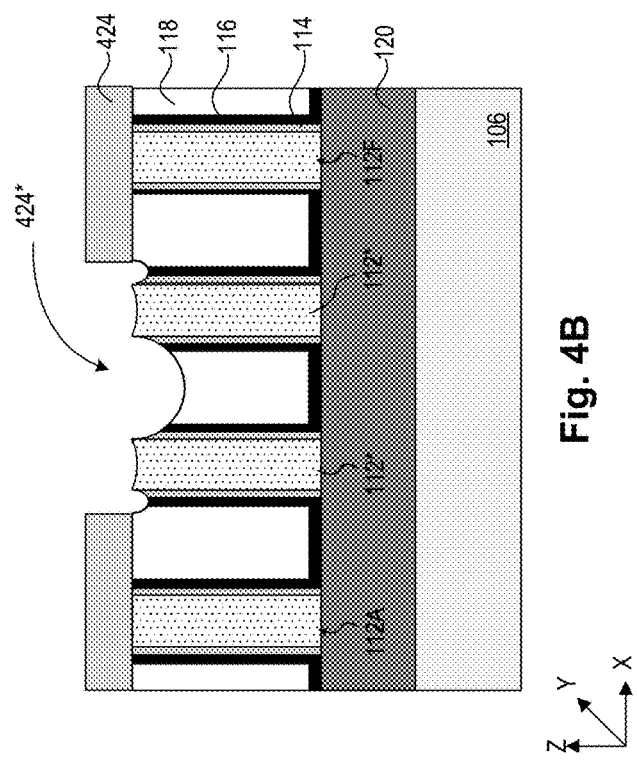
Fig. 4A
Fig. 4B
Fig. 4C
Fig. 4D

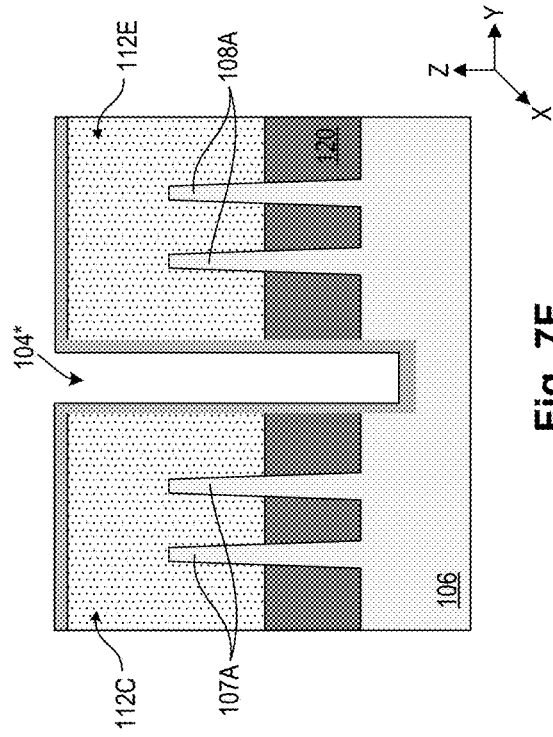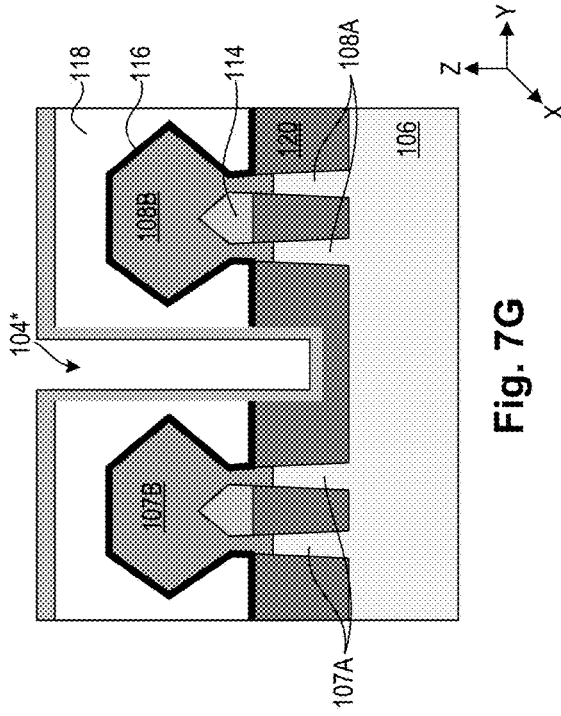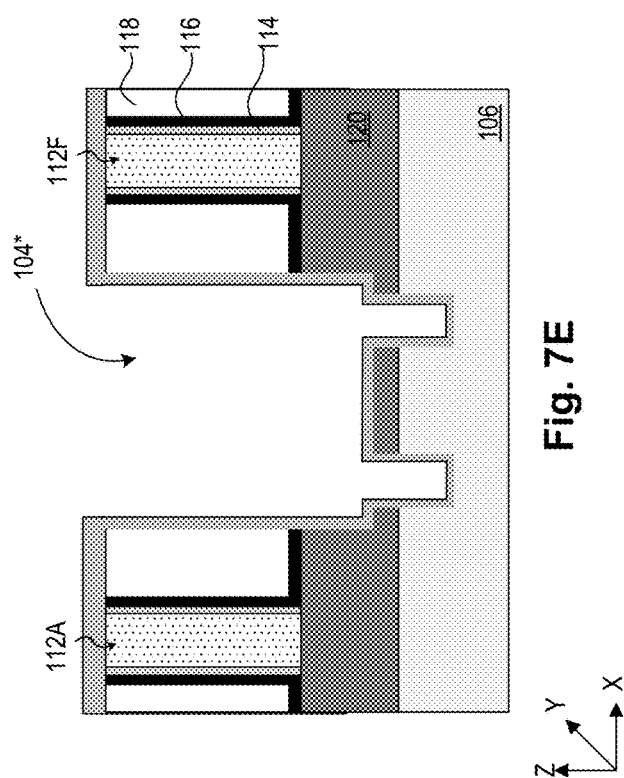

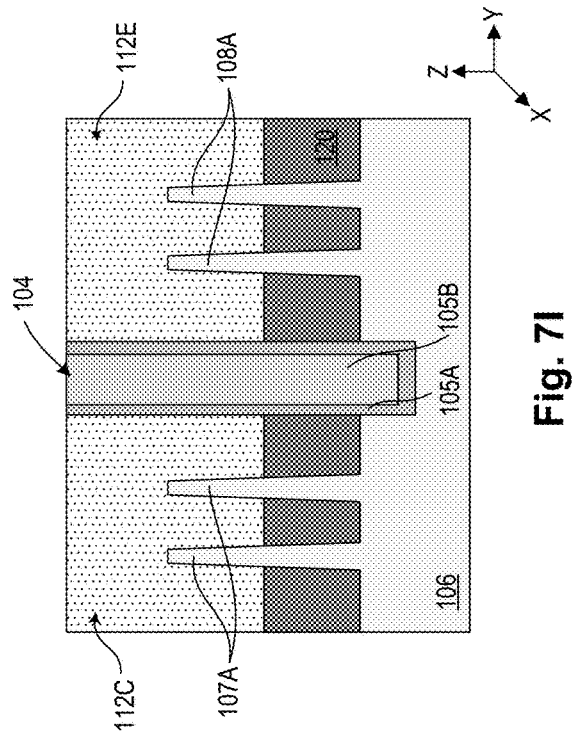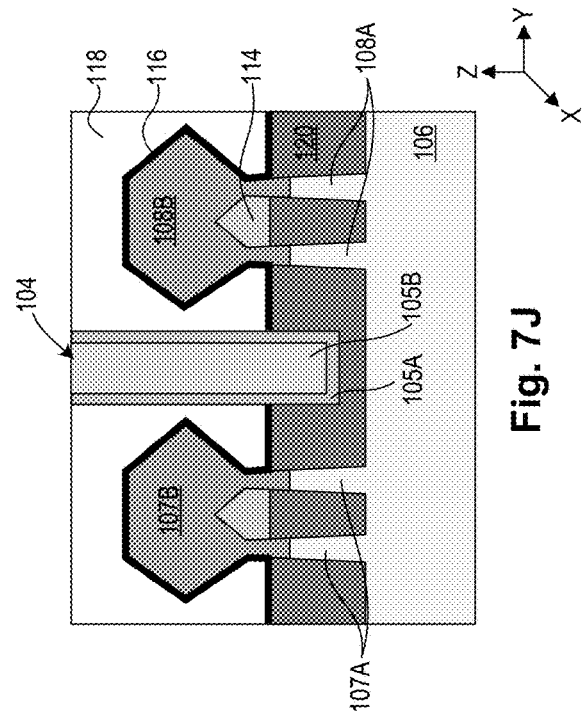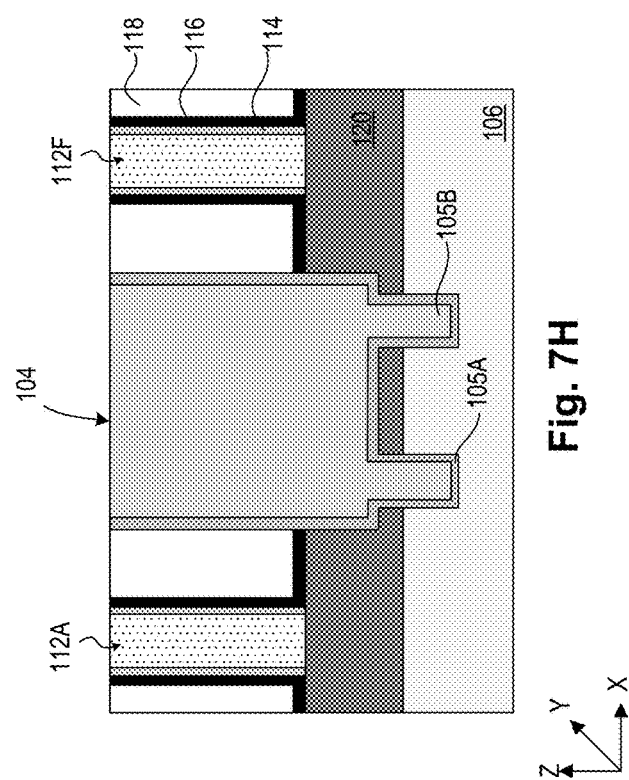

ISOLATION STRUCTURES FOR SEMICONDUCTOR DEVICES

CROSS-REFERENCE TO RELATED APPLICATIONS

This application is a divisional of U.S. patent application Ser. No. 16/937,297, titled "Isolation Structures for Semiconductor Devices," filed Jul. 23, 2020, which claims the benefit of U.S. Provisional Patent Application No. 62/967,270, titled "Isolation Structures for Semiconductor Devices," filed Jan. 29, 2020, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and interconnect structures for the semiconductor devices. Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 1F-1I illustrate a top view and cross-sectional views of a semiconductor device with an isolation structure, in accordance with some embodiments FIGS. 1J-1M illustrate a top view and cross-sectional views of a semiconductor device with an isolation structure, in accordance with some embodiments

FIGS. 3A-10D and 7E-7J illustrate cross-sectional views of a semiconductor device with an isolation structure at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
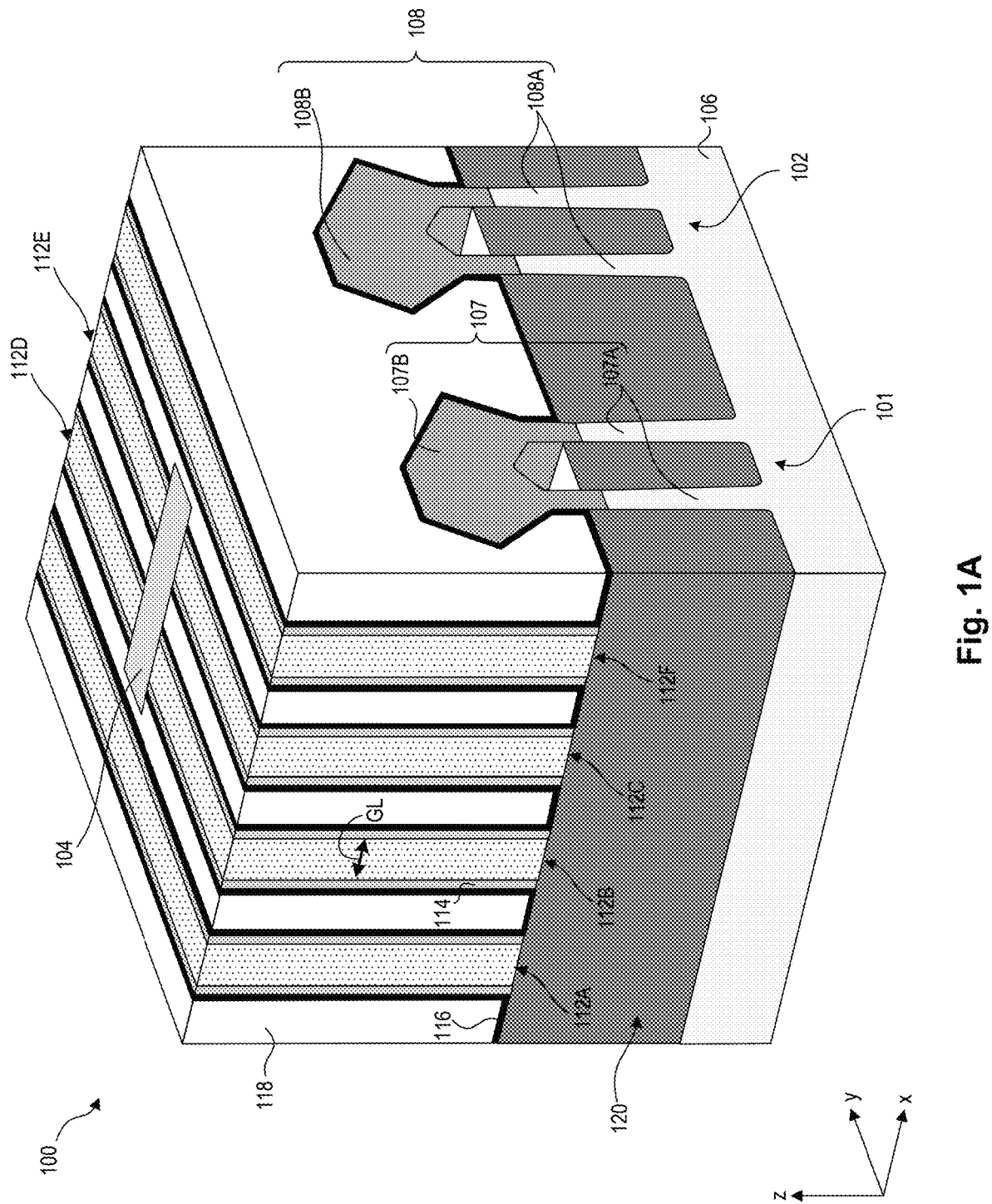
FIG. 1A illustrates an isometric view of a semiconductor device with an isolation structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a low dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "conductive" refers to an electrically conductive structure, layer, and/or region.

As used herein, the term "a gate pitch" refers to a sum of the distance between adjacent gate structures and the gate length of one of the adjacent gate structures.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Gate structures in finFETs can extend over two or more of the finFETs. For example, the gate structures can be formed as long gate structures extending across the active regions (e.g., fin regions) of the finFETs. Once the gate structures are formed, a patterning process can "cut" one or more of the long gate structures into shorter sections according to the desired structure. In other words, the patterning process can remove redundant gate portions of the one or more long gate structures to form one or more isolation trenches (also referred to as "metal cuts") between the finFETs and separate the long gate structures into shorter sections. This process is referred to as a cut-metal-gate (CMG) process. Subsequently, the isolation trenches formed between the separated sections of the long gate structures can be filled with a dielectric material to form isolation structures. The isolation structures can electrically isolate the separated gate structure sections.

With the scaling down of the semiconductor technology, the aspect ratios of the gate structures has increased, resulting in increased complexity in the CMG process. For example, the high aspect ratios of the gate structures make the removal of the redundant gate portions from the bottom and/or corner of the isolation trenches challenging. The presence of any residual gate portions in the isolation trenches prevents the subsequently formed isolation structures from electrically isolating the separate gate structure sections.

The present disclosure provides example isolation structures in a semiconductor device for improving device fabrication process control and example methods for fabricating the same. In some embodiments, the isolation structure can be formed by the dielectric filling of an isolation trench with an aspect ratio smaller than that of one or more gate structures and/or a horizontal dimension (e.g., along an X- and/or Y-axes) larger than a gate pitch of the gate structures. Such an isolation trench can be formed by removing two or more redundant gate portions from adjacent gate structures and by removing dielectric layers, such as gate spacers, etch stop layers, and inter-layer dielectric (ILD) layers between the adjacent gate structures. The smaller aspect ratios of the isolation trenches help to effectively remove the redundant gate portions from the difficult to etch locations, such as the corners and/or bottom of the isolation trenches with a simplified etching process in terms of the number of operations required, which in turn reduces device manufacturing cost. Such isolation trenches can also help to effectively fill the hard to fill locations, such as the corners and/or bottom of the isolation trenches at a faster deposition rate, which in turn reduces the overall process time and device manufacturing cost. Thus, the isolation structures with smaller aspect ratios than that of the gate structures can be formed with better CMG process control than isolation structure with aspect ratios and/or horizontal dimensions similar to the gate structures.

The device fabrication process control is further improved by using the single isolation structure to cut multiple long gate structures at the same time. The process of cutting multiple long gate structures at the same time with an isolation structure can eliminate CMG process-related variability along with CMG process-related complexity associated with cutting single gate structures with smaller isolation structures (e.g., length along an X-axis less than a gate pitch). Reducing process-related variability along with process-related complexity across the finFETs of the semiconductor device can reduce the performance variability across the finFETs and device manufacturing cost.

Further, the isolation structure can extend into the substrate and provide electrical isolation between p- and n-well regions under the finFETs. Also, the isolation structure can be used as an etch stop layer during the formation of S/D contact structures to control the height of S/D contact structures. If the height is greater than about 20 nm, the S/D contact structure can form parasitic capacitors with adjacent gate structures, which in turn produce undesirable parasitic capacitances in the finFETs. Parasitic capacitances can adversely impact the device performance, such as adversely impact the threshold voltages of the finFETs. Thus, the finFET fabrication process control is further improved by the use of the isolation structure.

A semiconductor device 100 with finFETs 101-102 is described with reference to FIGS. 1A-1M, according to some embodiments. FIG. 1A illustrates an isometric view of semiconductor device 100, according to some embodiments. Semiconductor device 100 can have different top views and cross-sectional views as illustrated in FIGS. 1B-1M, according to various embodiments. Though two finFETs are discussed with reference to FIGS. 1A-1M, semiconductor device 100 can have any number of finFETs. FinFETs 101-102 can be n-type, p-type, or a combination thereof. The discussion of elements of finFETs 101-102 with the same annotations applies to each other, unless mentioned otherwise.

Referring to FIG. 1A, finFETs 101-102 can be formed on a substrate 106. Substrate 106 can be a semiconductor material, such as silicon, germanium (Ge), silicon germanium (SiGe), a silicon-on-insulator (SOI) structure, and a combination thereof. Further, substrate 106 can be doped with p-type dopants (e.g., boron, indium, aluminum, or gallium) or n-type dopants (e.g., phosphorus or arsenic). In some embodiments, substrate 106 can include n- and p-well regions (not shown) when finFETs 101-102 have different conductivity type. For example, p-type finFET 101 can be formed on n-well region of substrate 106 and n-type finFET 102 can be formed on p-well region of substrate 106.

FinFET 101 can include fin structure 107 extending along an X-axis and gate structures 112B-112C, extending along a Y-axis, disposed on fin structure 107. Similarly, finFET 102 can include fin structure 109 extending along an X-axis and gate structures 112D-112E, extending along a Y-axis, disposed on fin structure 108. In some embodiments, besides independently-controlled gate structures 112B-112E, finFETs 101-102 can further include common gate structures 112A and 112F disposed on both fin structures 107-108. Fin structures 107-108 can be electrically isolated from each other by dielectric structures, such as etch stop layer (ESL)

116, inter-layer dielectric (ILD) layer 118, and shallow trench isolation (STI) region 120. ESL 116, ILD layer 118, and STI region 120 can include dielectric materials, such as silicon oxide, silicon nitride, silicon germanium oxide, and a combination thereof. Gate structures 112A-112F can be electrically isolated from each other by gate spacers 114, ESL 116, and ILD layer 118. Gate spacers 114 can include an insulating material, such as silicon oxide, silicon nitride, silicon oxynitride, a low-k material, and combination thereof.

In some embodiments, in addition to gate spacers 114, ESL 116, and ILD layer 118, gate structures 112B-112C can be electrically isolated from gate structures 112D-112E by isolation structure 104 to provide independently-controlled gate structures to each of finFETs 101-102. Isolation structure 104 can be formed in a CMG process (described in further detail below) to cut long gate structures (e.g., along a Y-axis) formed on fin structures 107-108 into shorter gate structures, such as gate structures 112B-112E. This practice of forming shorter gate structures provides better finFET fabrication process control over other finFET fabrication methods where shorter gate structures are formed at once. Forming shorter gate structures from the same original gate structure can eliminate process-related variability (e.g., during patterning, layer deposition, planarization, etc.) associated with forming multiple shorter gate structures like gate structures 112B-112E.

The finFET fabrication process control is further improved by using isolation structure 104 to cut multiple long gate structures at the same time. For example, as shown in FIG. 1A, isolation structure 104 with a length along an X-axis greater than a gate pitch can cut two long gate structures into four shorter gate structures 112B-112E at the same time. Though isolation structure 104 is shown to cut two long gate structures, isolation structure 104 can extend along an X-axis to cut more than two gate structures (e.g., cut gate structures 112A and/or 112F) into shorter gate structures of finFETs 101-102. The process of cutting multiple long gate structures at the same time with an isolation structure can eliminate CMG process-related variability along with CMG process-related complexity (discussed above) associated with cutting single gate structures with smaller isolation structures (e.g., length along an X-axis less than a gate pitch). Reducing process-related variability along with process-related complexity across finFETs 101-102 can reduce the performance variability across finFETs 101-102 and device manufacturing cost. Though one isolation structure 104 is discussed, semiconductor device 100 can have any number of isolation structures.

Figure 1B:
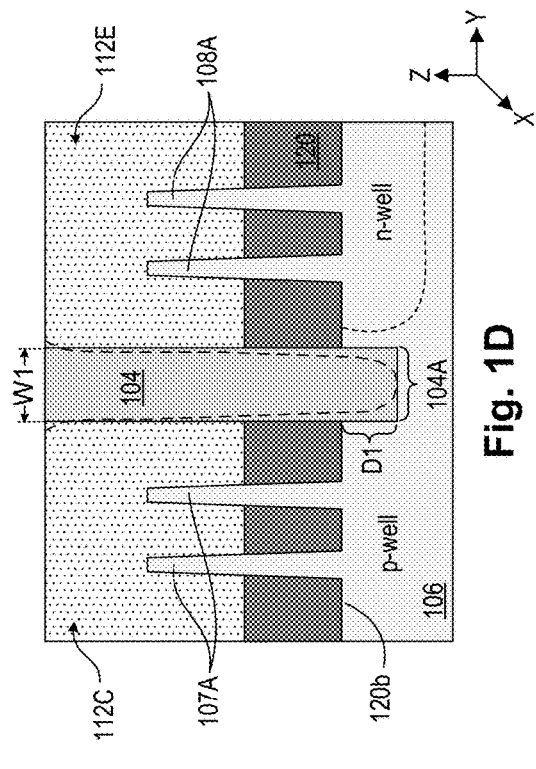
FIGS. 1B-1E illustrate a top view and cross-sectional views of a semiconductor device with an isolation structure, in accordance with some embodiments
Figure 1D:
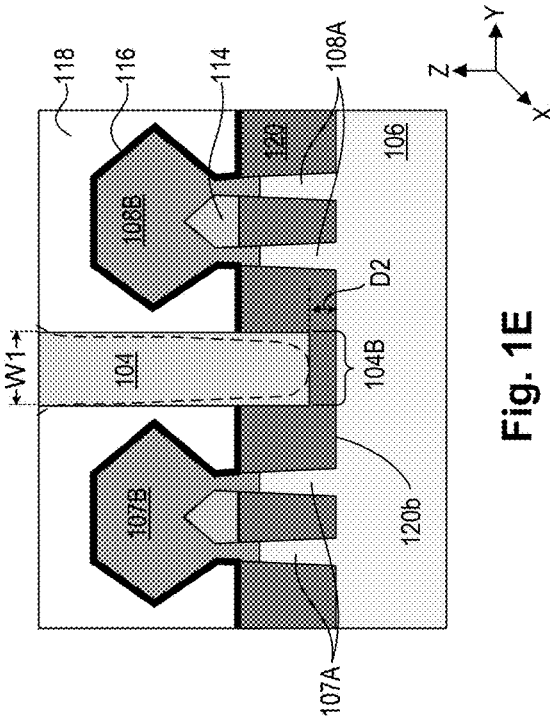
Figure 1C:
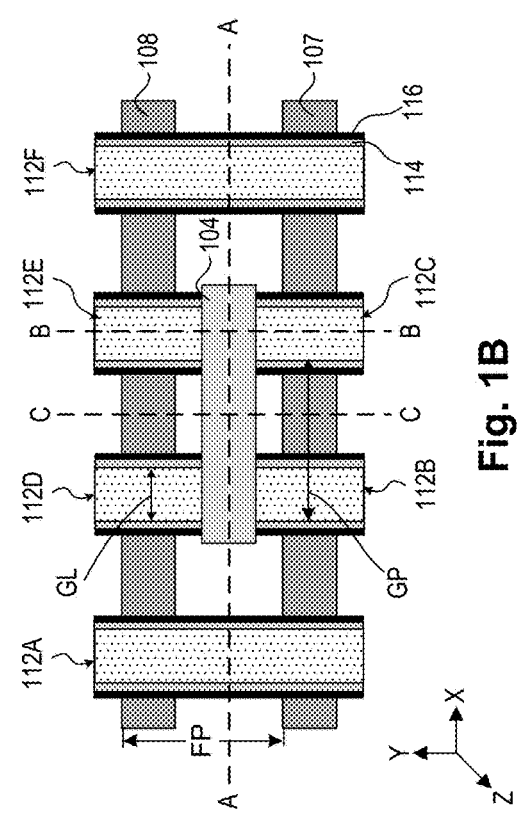
Figure 1E:
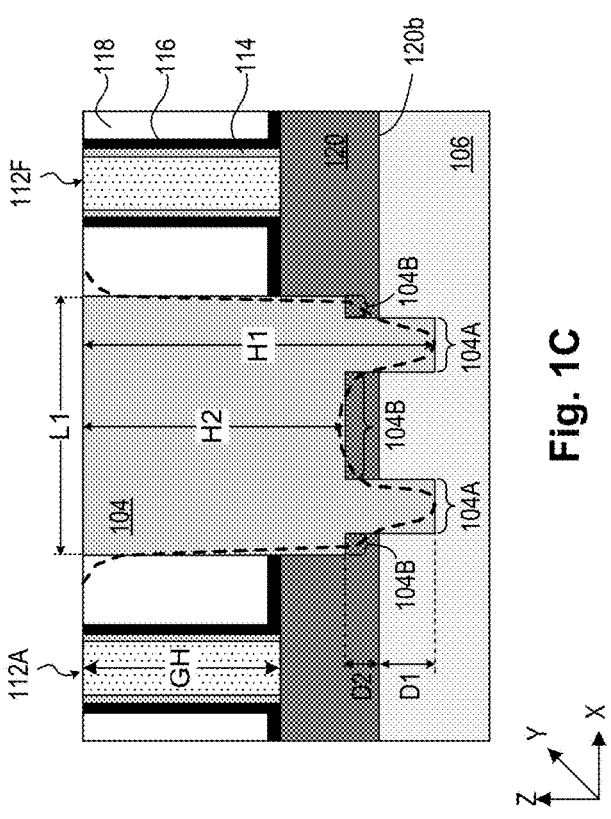

FIG. 1B illustrates a top view of semiconductor device 100 without ILD layer 118 and ESL 116 on fin structures 107-108 so that fin structures 107-108 are visible. FIGS. 1C-1E illustrate cross-sectional views along lines A-A, B-B, and C-C of FIG. 1B.

Referring to FIGS. 1A-1E, fin structures 107-108 can include fin regions 107A-108A and epitaxial regions 107B-108B disposed on respective fin regions 107A-108A. Portions of fin regions 107A-108A under epitaxial regions 107B-108B can be recessed within STI region 120 compared to portions of fin regions 107A-108A under gate structures 112A-112F. Fin regions 107A-108A can include a material similar to substrate 106 and can be formed from patterning and etching substrate 106. In some embodiments, fin regions 107A-108A can include a semiconductor material different from substrate 106 and can be formed from patterning and etching an epitaxial layer grown on substrate 106. In some embodiments, fin regions 107A-108A can have a semiconductor material with a crystalline microstructure—e.g., a non-amorphous or non-polycrystalline microstructure.

Epitaxial regions 107B-108B are formed on portions of respective fin regions 107A-108A, which are not covered by gate structures 112A-112F. Epitaxial regions 107B-108B can be source/drain (S/D) regions of respective finFETs 101-102 and can include epitaxially-grown semiconductor materials similar to or different from each other. In some embodiments, the epitaxially-grown semiconductor material can include the same material or a different material from the material of substrate 106. Depending on the conductivity type of finFETs 101-102, epitaxial regions 107B-108B can include (i) boron (B) doped SiGe, B-doped Ge, or B-doped germanium tin (GeSn) for p-type finFETs 101-102; and (ii) carbon-doped Si (Si:C), phosphorous doped Si (Si:P) or arsenic doped Si (Si:As) for n-type finFETs 101-102. Further, epitaxial regions 107B-108B can include multiple layers (e.g., two layers, three layers, or more layers) with different dopant concentration and/or different material composition.

Gate structures 112A-112F are isolated from epitaxial regions 107B-108B by gate spacers 114. Gate structure 112A-112F can be multi-layered structures. The different layers of gate structures 112A-112F are not shown for simplicity. Each of gate structure 112A-112F can include an interfacial oxide (IO) layer, a high-k gate dielectric layer on the IO layer, a work function metal (WFM) layer on the high-k dielectric layer, and a gate metal fill layer on the WFM layer. The IO layer can include silicon oxide ($SiO_2$) silicon germanium oxide ($SiGeO_x$) or germanium oxide ($GeO_x$). The high-k gate dielectric layer can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). The WFM layer can include titanium aluminum (TiAl), titanium aluminum carbide (TiAlC), tantalum aluminum (TaAl), tantalum aluminum carbide (TaAlC), and a combination thereof. The gate metal fill layer can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Referring to FIGS. 1B-1E, isolation structure 104 can be formed with an aspect ratio greater than the aspect ratio of each gate structures 112A-112F or than the combined aspect ratio of two or more of gate structures 112A-112F to improve the CMG process control as discussed above. To achieve a smaller aspect ratio, isolation structure 104 can be formed with a length L1 along an X-axis equal to or greater than at least a gate pitch (e.g., GP shown in FIG. 1B) of gate structures 112A-112F and a height H1 (or H2) along a Z-axis greater than a gate height (e.g., GH shown in FIG. 1C) of gate structures 112A-112F. Further, isolation structure 104 can have a width W1 along a Y-axis less than a fin pitch (e.g., FP shown in FIG. 1B). The gate pitch is defined as a sum of a distance along an X-axis between adjacent gate structures and a gate length (e.g., GL shown in FIG. 1B) of one of the adjacent gate structures. The fin pitch is defined as a sum of a distance along a Y-axis between adjacent fin structures and a fin width along a Y-axis of one of the adjacent fin structures. The aspect ratio of isolation structure 104 is defined as a ratio of its length L1 to its height H1 or H2. The aspect ratio of each gate structures 112A-112F is defined as a ratio of its gate length GL to its gate height GH.

Isolation portions 104A-104B of isolation structure 104 can have different heights (e.g., heights H1-H2 shown in FIG. 1C) at different areas of semiconductor device 100. In some embodiments, isolation portions 104A between gate structures 112B and 112D, and between gate structures 112C and 112E extend into substrate 106, while isolation portions 104B extend into STI region 120 and does not extend into substrate 106 as shown in FIGS. 1C-1E. In some embodiments, isolation portions 104A-104B can both extend into substrate 106 (not shown), but isolation portions 104A can extend deeper into substrate 106 than isolation portions 104B. The different heights H1-H2 of respective isolation portions 104A-104B are a result of the etching process used in the formation of isolation structure 104 described in further detail below. The horizontal dimensions along an X-axis of isolation portions 104A in substrate 106 can correspond to the gate length of gate structures 112B-112E. The horizontal dimensions along an X-axis of isolation portions 104B in STI region 120 can correspond to the distance between gate structures 112B-112C or 112D-112E.

In some embodiments, height H1 can be greater than height H2 by about 65 nm to about 250 nm. Isolation portions 104A can extend into substrate 106 by a distance D1 of about 5 nm to about 250 nm below STI surface 120b. The bottom surfaces of isolation portions 104B can be (i) above STI surface 120b by a distance D2 of about 10 nm to about 60 nm, (ii) below STI surface 120b by a distance (not shown) of about 10 nm, or (iii) at STI surface 120b. Isolation structure 104 can have a length L1 ranging from about 80 nm to about 140 nm. These dimension ranges of isolation structure 104 provide the aspect ratio for effective removal of redundant gate portions before the dielectric filling process to form isolation structure 104, which is described in detail below. If length L1 is shorter than 80 nm, distance D1 is shorter than 5 nm, and/or distance D2 is greater than 60 nm above STI surface 120b, the aspect ratio of isolation structure 104 may not be sufficient for effective removal of the redundant gate portions. On the other hand, if length L1 is greater than 140 nm, distance D1 is greater than 250 nm, and/or distance D2 is greater than 10 nm below STI surface 120b, the process time (e.g., the etching and dielectric filling times) to form isolation structure 104 increases, which increase device manufacturing cost.

Further, the regions of isolation portions 104A that extend distance D1 into substrate 106 can provide electrical isolation between p- and n-well regions (shown in FIG. 1D) when p- and n-well regions are formed in portions of substrate 106 under finFETs 101 and 102, respectively. Thus, if distance D1 is shorter than 5 nm, there may be leakage between the p- and n-well regions. Though FIG. 1D shows p- and n-well regions in finFETs 101 and 102, respectively, finFETs 101-102 both may have n- or p-well regions (not shown) or may not have any well-regions.

In some embodiments, side and bottom surfaces of isolation structure 104 can have profiles as shown with dashed lines in FIGS. 1C-1E instead of the straight solid lines shown in FIGS. 1C-1E. The tapered side surfaces and/or the curved bottom surfaces illustrated with the dashed lines in FIGS. 1C-1E can be attributed to the etching process used in the formation of isolation structure 104 described in further detail below. In some embodiments, isolation structure 104 can include one or more dielectric materials, such as silicon nitride, silicon oxide, silicon oxycarbide, and a combination thereof.

FIG. 1F illustrates a top view of semiconductor device 100 when a S/D contact structure 122 is present. FIGS. 1G-1I illustrate cross-sectional views along lines D-D, E-E, and F-F of FIG. 1F. The discussion of elements with the same annotations in FIGS. 1B-1I applies to each other, unless mentioned otherwise.

In some embodiments, S/D contact structure 122 can be formed across fin structures 107-108 to electrically connect epitaxial regions 107B-108B to other elements of finFETs 101-102 and/or of an integrated circuit (not shown). S/D contact structure 122 can include conductive materials, such as ruthenium (Ru), iridium (Ir), nickel (Ni), Osmium (Os), rhodium (Rh), aluminum (Al), molybdenum (Mo), tungsten (W), cobalt (Co), and copper (Cu).

In some embodiments, the portion of S/D contact structure 122 on isolation structure can have a height H3 along a Z-axis and the portions of S/D contact structure 122 on epitaxial regions 107B-108B can have a height H4 along a Z-axis, in which height H3 is greater than height H4 or height H3 is substantially equal to height H4. In some embodiments, heights H3-H4 can range from about 5 nm to about 20 nm. If heights H3-H4 are less than 5 nm, the conductive materials in S/D contact structure 122 may be too thin for adequate conductivity of S/D contact structure 122. On the other hand, if height H3 is greater than 20 nm, S/D contact structure 122 can form parasitic capacitors with gate structures 112B-112F, which in turn produce undesirable parasitic capacitances in finFETs 101-102. Parasitic capacitances can adversely impact the device performance, such as adversely impact the threshold voltages of finFETs 101-102.

To control height H3 of S/D contact structure 122, isolation structure 104 can be used as an etch stop layer during the formation of S/D contact structure 122, which is discussed in further detail below. As an etch stop layer, isolation structure 104 can prevent over-etching of ILD layer 118 between fin structures 107-108 when a contact opening is formed prior to filling the contact opening with conductive material to form S/D contact structure 122. Thus, the finFET fabrication process control is further improved by the use of isolation structure 104.

FIG. 1J illustrates a top view of semiconductor device 100 when S/D contact structures 122 and 122* are present. FIGS. 1L-1M illustrate cross-sectional views along lines G-G, H-H, and I-I of FIG. 1J. The discussion of elements with the same annotations in FIGS. 1B-1M applies to each other, unless mentioned otherwise. The discussion of S/D contact structures 122 and 122* applies to each other, unless mentioned otherwise. The discussion of isolation structure 104 in FIGS. 1A-1I applies to isolation structure 104** in FIGS. 1J-1M, unless mentioned otherwise.

Isolation structure 104** can be formed by extending isolation structure 104 along an X-axis by isolation portions 104C, as shown in FIG. 1K. Isolation portions 104C are formed by removing portions of ESL 116, ILD layer 118, and STI 120 between isolation structure 104 and gate structures 112A and 112F. Similar to isolation portion 104B, isolation portions 104C can be used as etch stop layer for process control in the formation of S/D contact structures 122*.

Figure 2:
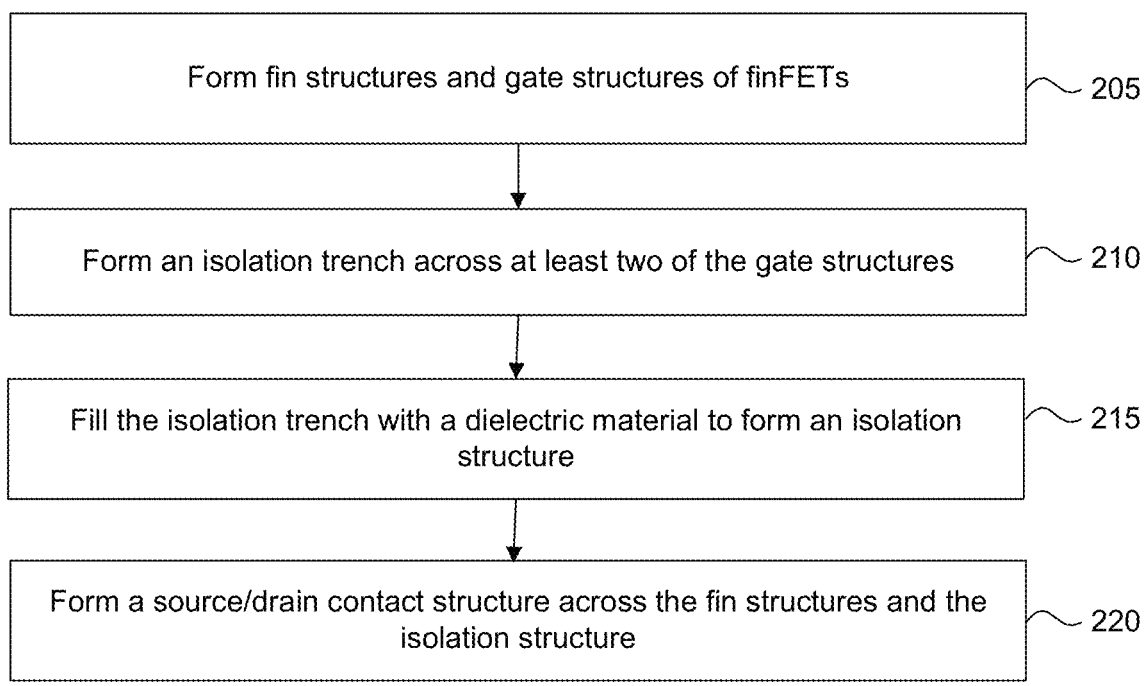
FIG. 2 is a flow diagram of a method for fabricating a semiconductor device with an isolation structure, in accordance with some embodiments.
Figure 5A:
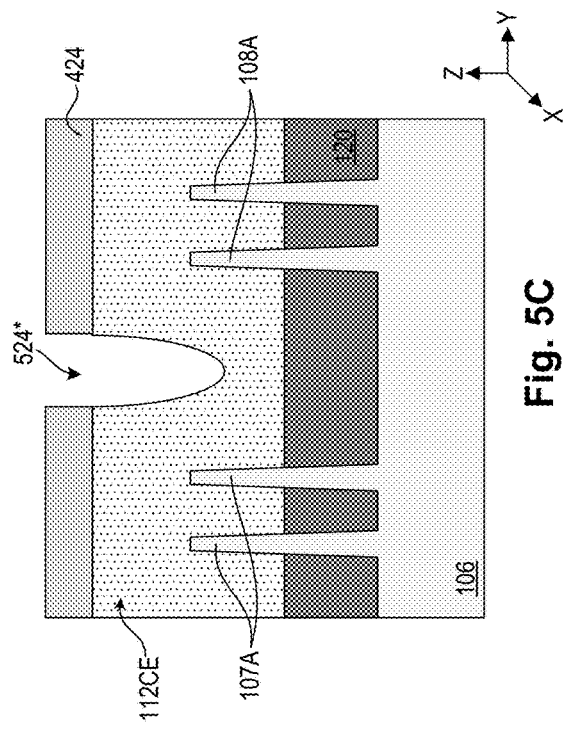
Figure 5C:
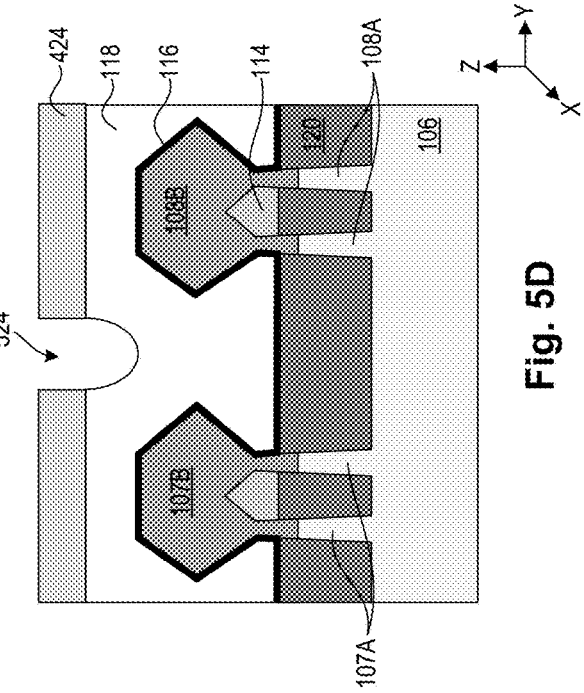
Figure 5B:
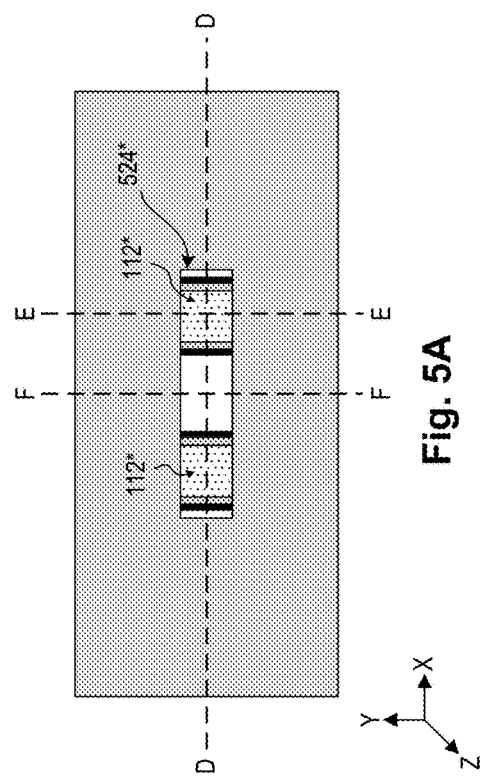
Figure 5D:
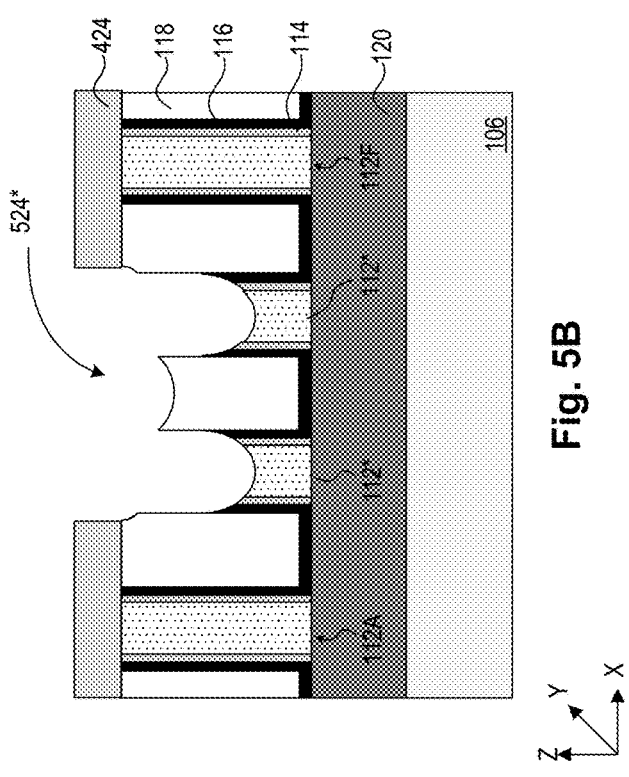

FIG. 2 is a flow diagram of an example method 200 for fabricating semiconductor device 100, according to some embodiments. For illustrative purposes, the operations illustrated in FIG. 2 will be described with reference to FIGS. 3A-10D and 7E-7J. FIGS. 3A-10A are top views at various stages of fabricating semiconductor device 100, according to some embodiments. FIGS. 3B-10B, 3C-10C, and 3D-10D are cross-sectional views along respective lines D-D, E-E, and F-F of FIGS. 3A-10A at various stages of fabricating semiconductor device 100, according to some embodiments.

Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 3A-10D and 7E-7J with the same annotations as elements in FIGS. 1A-1M are described above.

In operation 205, fin structures and gate structures of finFETs are formed. For example, as shown in FIGS. 3A-3D, fin structures 107-108 with fin regions 107A-108A and epitaxial regions 107B-108B can be formed on substrate 106 and gate structures 112A, 112BD, 112CE, and 112F can be formed on fin regions 107A-108A. Gate structures 112BD-112CE will be cut in subsequent processes to form gate structures 112B-112E and isolation structure 104. The formation of fin structures 107-108 can include sequential operations of: (i) patterning substrate 106 to form fin regions 107A-108A, (ii) forming polysilicon gate structures (not shown) on portions of fin regions 107A-108B that will have gate structures 112BD, 112CE, 112A, and 112F formed in subsequent processes, (iii) etching back portions of fin regions 107A-108A that are not covered by the polysilicon gate structures, (iv) forming epitaxial regions 107B-108B on the etched back fin regions 107A-108A, and (v) replacing the polysilicon gate structures with gate structures 112A, 112BD, 112CE, and 112F.

Referring to FIG. 2, in operation 210, an isolation trench is formed across at least two of the gate structures. For example, an isolation trench 604 can be formed across gate structures 112BD and 112CE, as described with reference to FIGS. 4A-6D. The formation of isolation trench 604 can include sequential operations of: (i) patterning a masking layer 424 on the structures of FIGS. 3A-3D to form an opening 424*, and (ii) etching redundant gate portions 112* of gate structures 112BD-112CE and redundant dielectric portions through opening 424*. The redundant dielectric portions includes portions of gate spacers 114 and ESL 116 on the sidewalls of redundant gate portions 112* and portions of ILD layer 118 between redundant gate portions 112*.

In some embodiments, masking layer 424 is a photoresist material, which is spin-coated on the structures of FIGS. 3A-3D and then patterned to form opening 424*. In some embodiments, masking layer 424 is a silicon nitride layer, or any other suitable material that can act as an etch mask and prevent the masked regions of the structures of FIGS. 3A-3D from being etched. Opening 424* exposes redundant gate portions 112* and the redundant dielectric portions that are removed in subsequent processes to form isolation trench 604. In some embodiments, opening 424* can be extended further along an X-axis to expose portions of ILD layer 118 between redundant gate portions 112* and gate structures 112A and 112B to form longer isolation trench 604, and as a result longer isolation structure like isolation structure 104** (discussed above with reference to FIG. 1K).

The etching process to remove the exposed structures through opening 424* can include a cyclic process, where each cycle includes two etching operations. The first etching operation can include a dry etching process using a first etchant that has a higher etch selectivity for the material (e.g., $SiO_2$) of ILD layer 118 than the metallic material of redundant gate portions 112*. The first etchant can include a hydrogen fluoride (HF) based gas or a carbon fluoride ($C_xF_y$) based gas. The second etching operation can include a dry etching process using a second etchant that has a higher etch selectivity for the material of redundant gate portions 112* than the material of ILD layer 118. The second etchant can include a chlorine based gas.

Figure 6A:
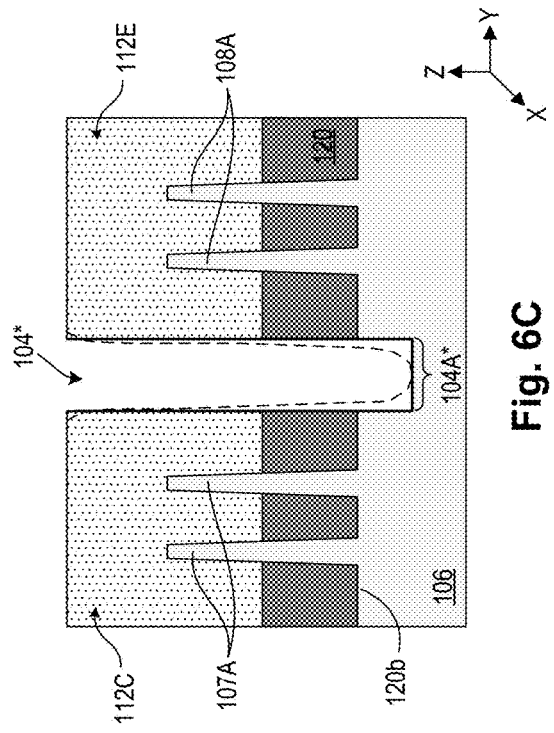

The first cycle of the etching process can start with the first or second etching operation. In some embodiments, the first cycle can start by performing the first etching operation to form opening 424* of FIGS. 4B-4D, where the exposed redundant dielectric portions are etched deeper than redundant gate portions 112*. The first etching operation can be followed by the second etching operation on the structures of FIGS. 4A-4D to form opening 525* of FIGS. 5A-5D, where redundant gate portions 112* are etched deeper than the redundant dielectric portions. This cycle of the etching process is repeated until STI region 120 and substrate 106 underlying the etched redundant gate portions 112* and redundant dielectric portions are etched to form isolation trench 104*, as shown in FIGS. 6A-6D. Isolation trench 104* cuts two gate structures 112BD-112CE into four gate structures 112B-112F, as shown in FIG. 6A.

Figure 6C:
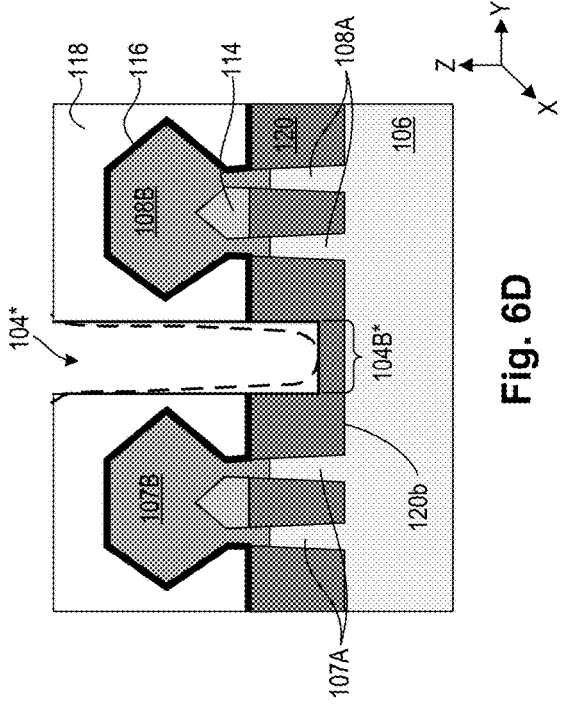
Figure 6B:
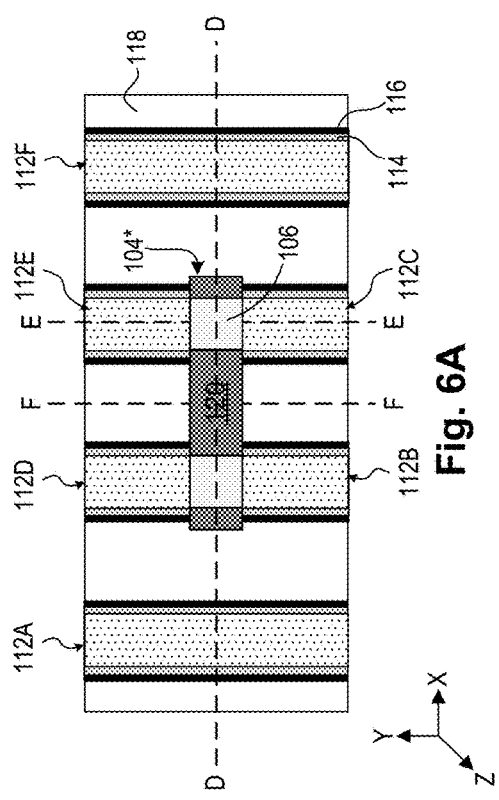
Figure 6D:
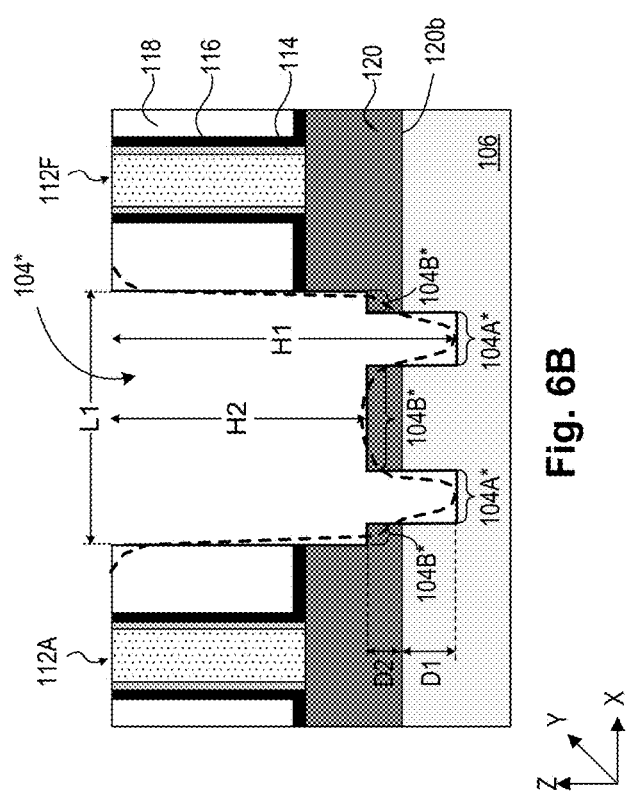

Trench portions 104A*-104B* of isolation trench 104* have different heights H1-H2. Trench portions 104A* corresponding to the etched redundant gate portions 112* extend into substrate 106, while trench portions 104B* corresponding to the etched redundant dielectric portions extend into STI region 120 and does not extend into substrate 106, as shown in FIGS. 6B-6D. In some embodiments, trench portions 104A*-104B* can both extend into substrate 106 (not shown), but trench portions 104A* can extend deeper into substrate 106 than trench portions 104B*. The different heights H1-H2 of respective trench portions 104A*-104B* can be attributed to the different etching rates of the materials of ILD layer 118 and redundant gate portions 112*. The metallic material of redundant gate portions 112* has a higher etching rate than the material of ILD layer 118, as result of which trench portions 104A* can etch deeper into substrate 106 than trench portions 104B*. The horizontal dimensions along an X-axis of trench portions 104A* in substrate 106 can correspond to the gate length of gate structures 112BD-112CE and the horizontal dimensions along an X-axis of trench portions 104B* in STI region 120 can correspond to the distance between gate structures 112BD-112CE.

In some embodiments, height H1 can be greater than height H2 by about 65 nm to about 250 nm. Trench portions 104A* can extend into substrate 106 by a distance D1 of about 5 nm to about 250 nm below STI surface 120b. The width of trench portions 104A* along an X-axis depends on the gate length of redundant gate portions 112*. In some embodiments, the width can be about 10 nm to about 40 nm or can be about 15 nm greater or smaller than the gate length. The bottom surfaces of trench portions 104B* can be (i) above STI surface 120b by a distance D2 of about 10 nm to about 60 nm, (ii) below STI surface 120b by a distance (not shown) of about 10 nm, or (iii) at STI surface 120b. Isolation trench 104* can have a length L1 ranging from about 80 nm to about 140 nm.

These dimension ranges of isolation trench 104* provide the aspect ratio for effective removal of redundant gate portions 112* without leaving any gate material residue in isolation trench 104*. If length L1 is less than about 80 nm, distance D1 is shorter than about 5 nm, and/or distance D2 is greater than about 60 nm above STI surface 120b, the aspect ratio of isolation trench 104* may not be sufficient for effective removal of redundant gate portions 112*. On the other hand, if length L1 is greater than about 140 nm, distance D1 is greater than about 250 nm, and/or distance D2 is greater than about 10 nm below STI surface 120b, the etching process time increases, which increases device manufacturing cost.

In some embodiments, side and bottom surfaces of isolation trench 104* can have profiles as shown with dashed lines in FIGS. 6B-6D instead of the straight solid lines shown in FIGS. 6B-6D. The tapered side surfaces and/or the curved bottom surfaces illustrated with the dashed lines in FIGS. 6B-6D can be attributed to the etching process.

Figure 7C:
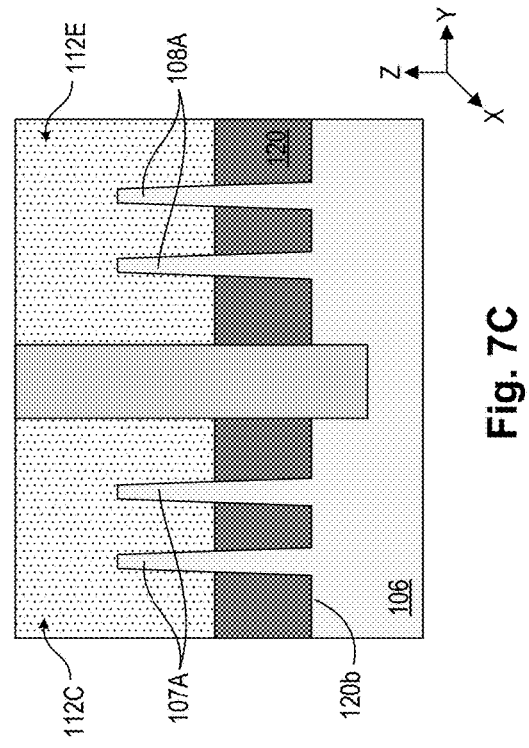
Figure 7D:
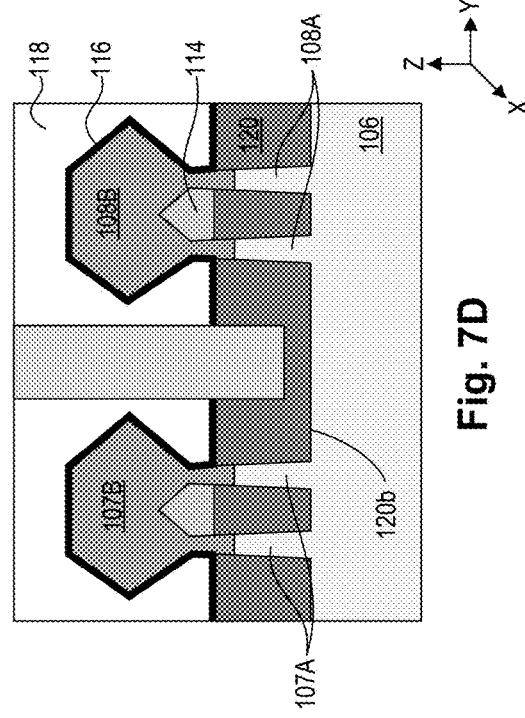
Figure 7A:
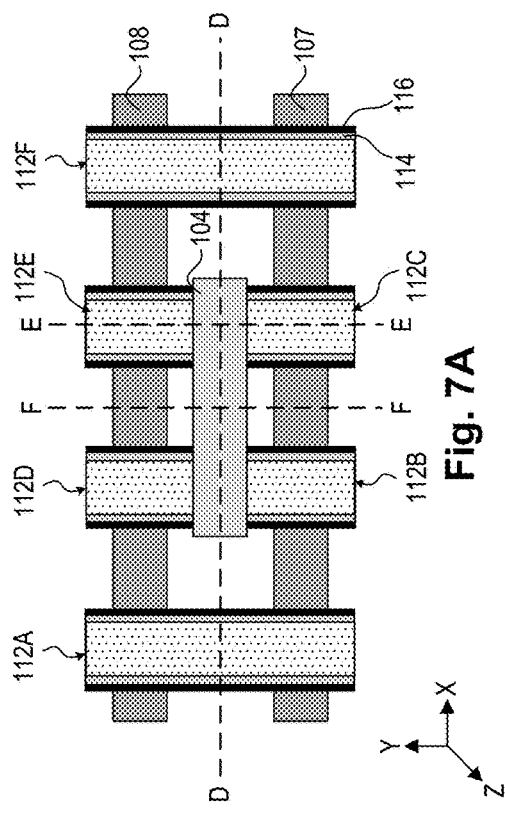
Figure 7B:
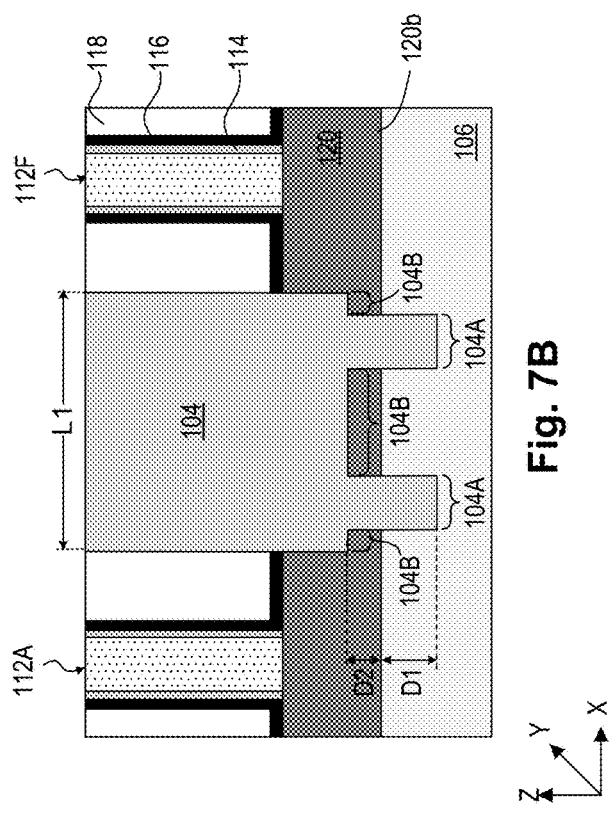

Referring to FIG. 2, in operation 215, the isolation trench is filled with a dielectric material to form an isolation structure. For example, as shown in FIGS. 7A-7D, isolation trench 104* can be filled with a dielectric material to form isolation structure 104. In some embodiments, the dielectric filling of isolation trench 104* can include a bottom up deposition of the dielectric material into isolation trench 104* followed by a chemical mechanical polishing (CMP) process to substantially coplanarize the top surfaces of isolation structure 104, ILD layer 118, and gate structures 112A and 112F, as shown in FIGS. 7B-7D. In some embodiments, the dielectric filling process can include an ALD process that substantially conformally deposits (shown in FIGS. 7E-7G) the dielectric material into isolation trench 104* until the dielectric material fills isolation trench 104* to form isolation structure 104 of FIGS. 7A-7D. The ALD process can be followed by a CMP process to substantially coplanarize the top surfaces of isolation structure 104, ILD layer 118, and gate structures 112A and 112F, as shown in FIGS. 7B-7D. In some embodiments, a bi-layer 105A-105B of two different dielectric materials can be substantially conformally deposited into isolation trench 104* to form isolation structure 104, as shown in FIGS. 7H-7J.

Figure 8C:
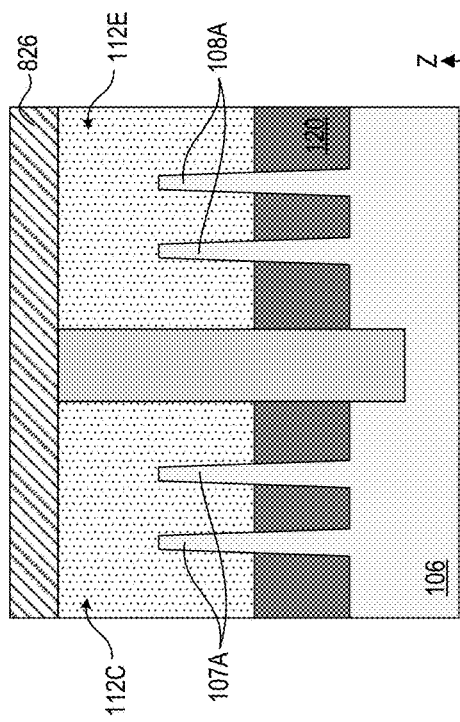
Figure 8D:
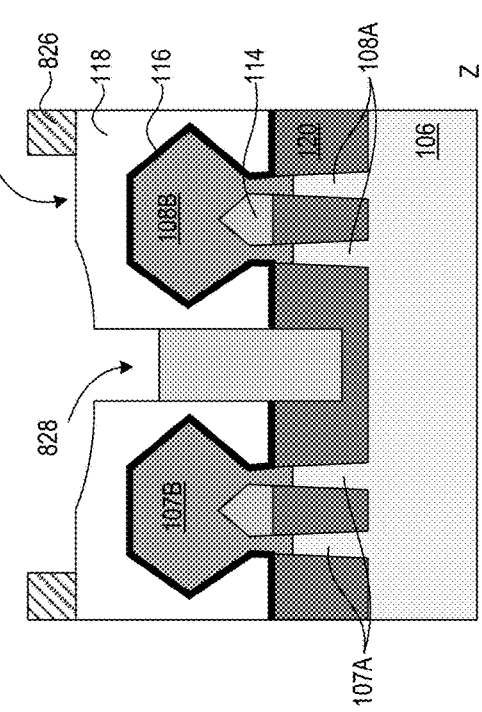
Figure 8A:
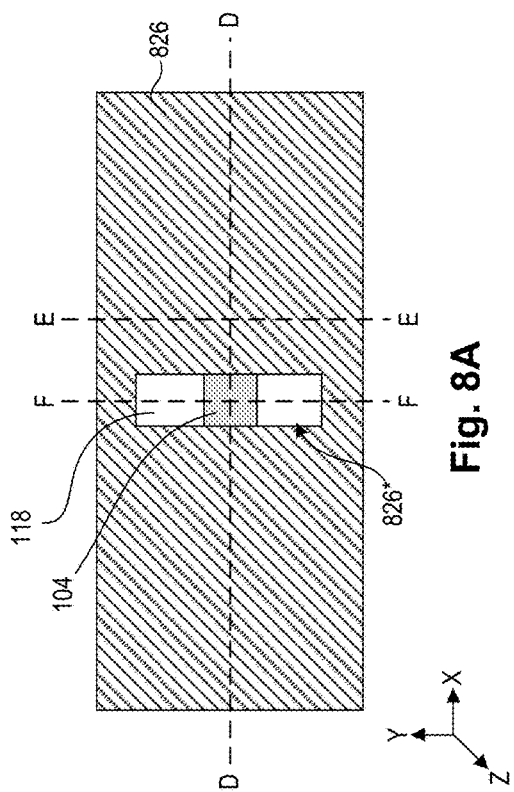
Figure 8B:
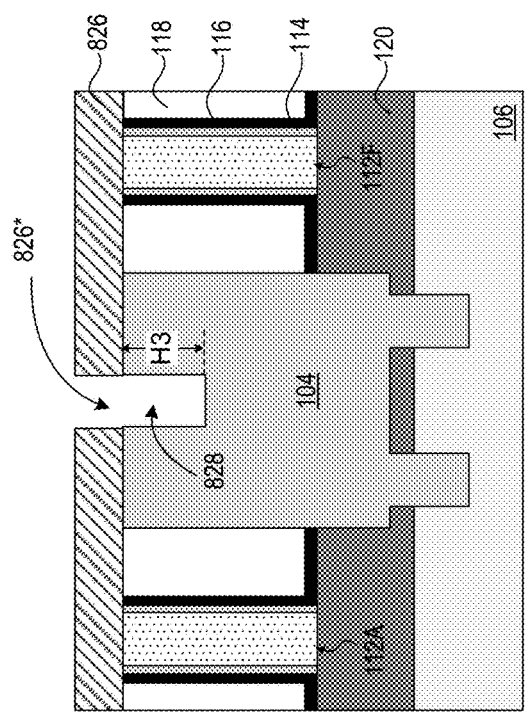
Figure 9C:
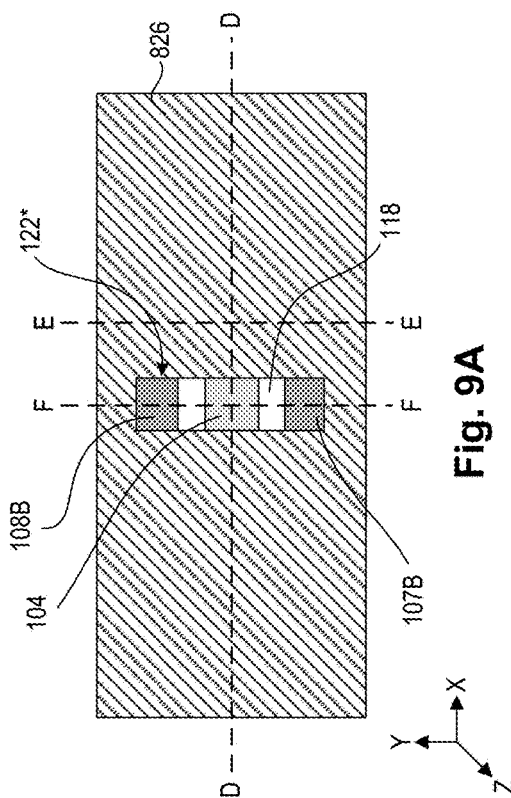
Figure 9D:
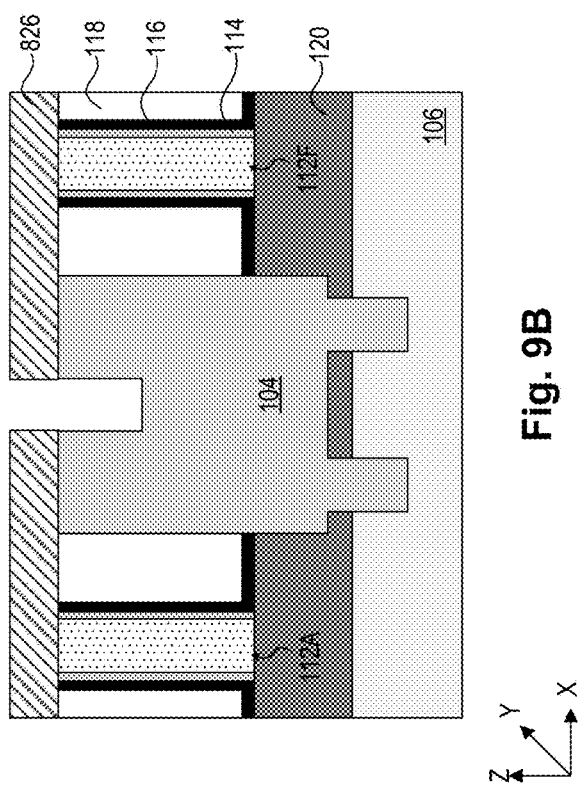
Figure 9A:
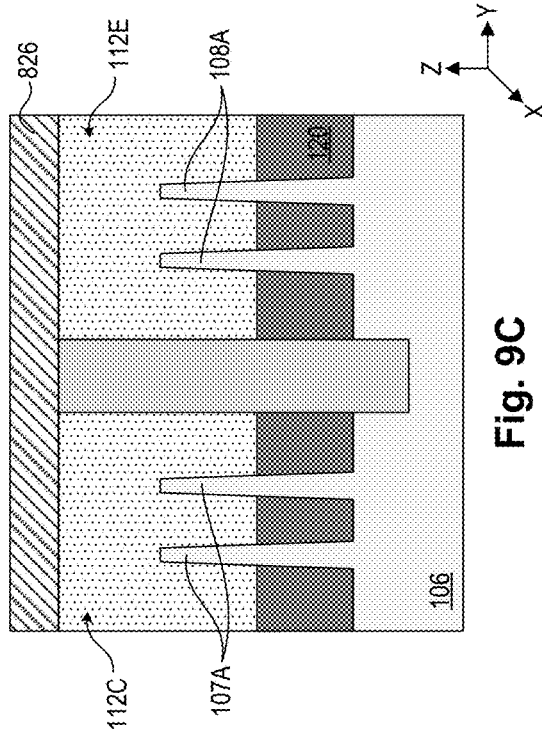
Figure 9B:
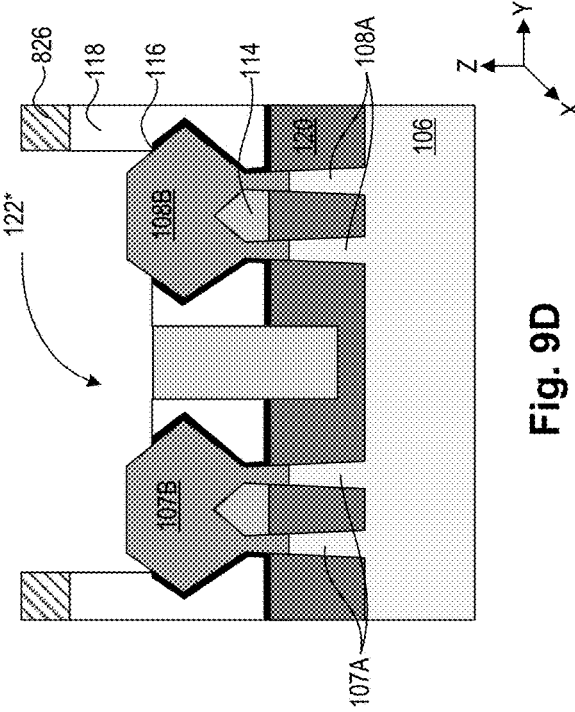

Referring to FIG. 2, in operation 220, a S/D contact structure is formed across the fin structures and the isolation structure. For example, S/D contact structure 122 can be formed across fin structures 107-108 and isolation structure 104, as described with reference to FIGS. 8A-10D. The formation of S/D contact structure 122 can include sequential operations of: (i) patterning a masking layer 826 on the structures of FIGS. 7A-7D to form an opening 826*, as shown in FIGS. 8A-8B and 8D, (ii) performing a first etching process to etch back the portion of isolation structure 104 exposed through opening 826* to form a cavity 828 (shown in FIGS. 8B and 8D) in isolation structure 104, (iii) performing a second etching process to etch the portions of ILD layer 118 and ESL 116 exposed through opening 826* to form a S/D contact opening 122*, as shown in FIGS. 9A-9B and 9D, and (iv) filling S/D contact opening 122* with a conductive material to form S/D contact structure 122, as shown in FIGS. 10A-10D.

In some embodiments, masking layer 826 is a photoresist material, which is spin-coated on the structures of FIGS. 7A-7D and then patterned to form opening 826*. In some embodiments, masking layer 424 is a silicon nitride layer or any other suitable material that can act as an etch mask and prevent the masked regions of the structures of FIGS. 7A-7D from being etched.

Figure 10C:
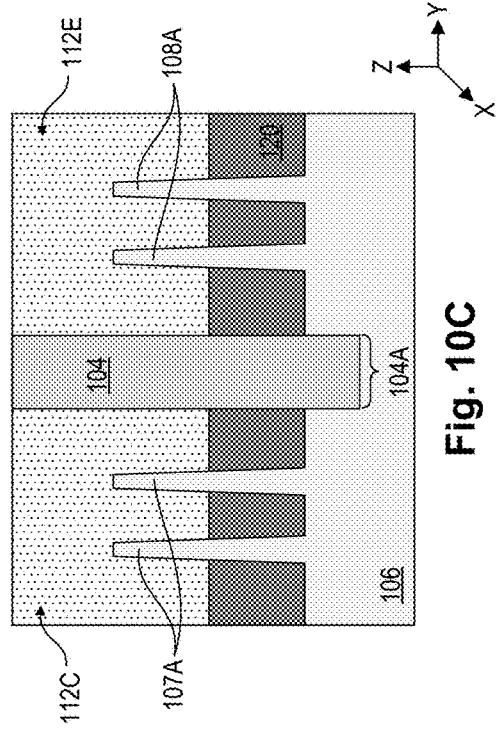
Figure 10D:
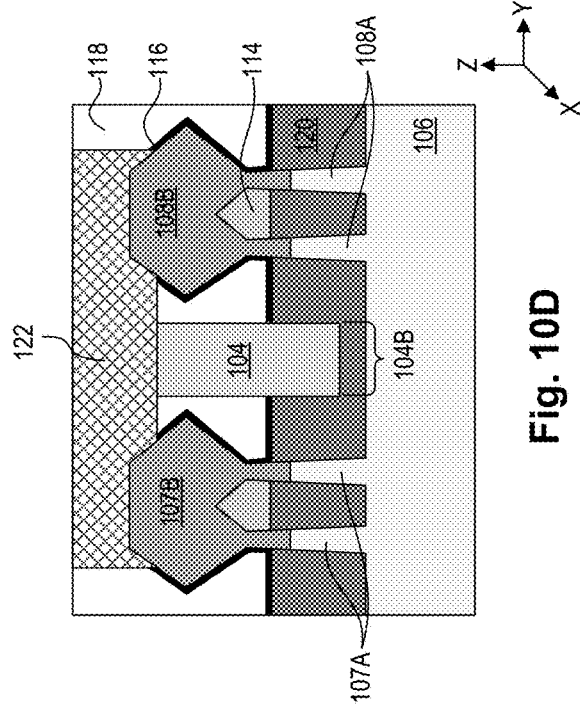
Figure 10A:
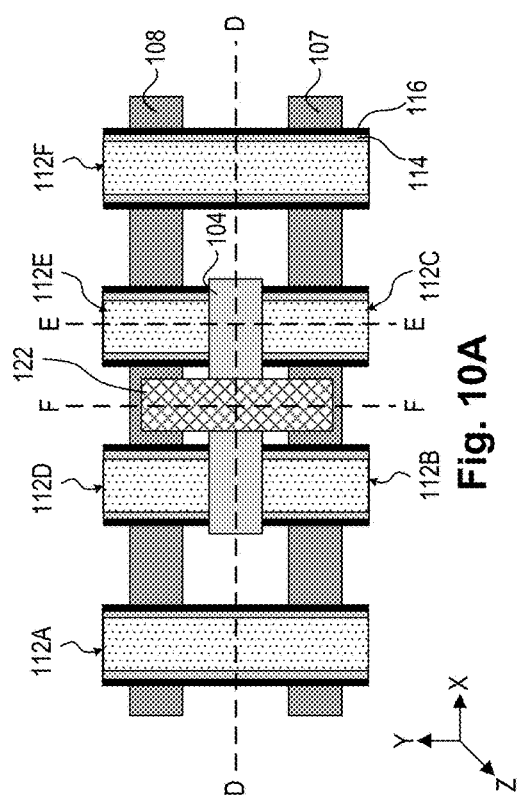
Figure 10B:
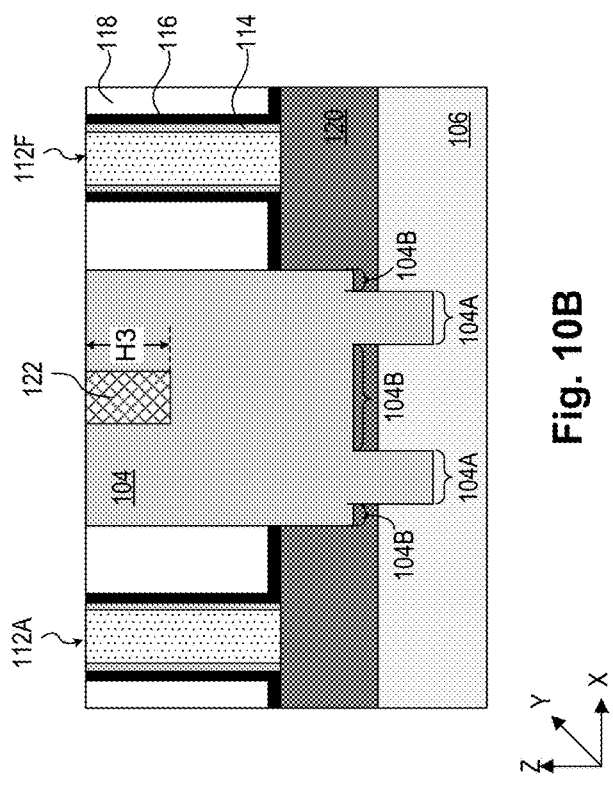

The first etching process can include a dry etching process using a first etchant that has a higher etch selectivity for the dielectric material (e.g., SiN) of isolation structure 104 than the material (e.g., SiO$_2$) of ILD layer 118. The first etchant can include a carbon hydrogen fluoride ($C_xH_yF_z$) based gas. The second etching process can include a dry etching process using a second etchant that has a higher etch selectivity for the material of ILD layer 118 than the material of isolation structure 104. The second etchant can include a carbon fluoride ($C_xF_y$) based gas. In some embodiments, the filling of S/D contact opening 122* can include a bottom up deposition of the conductive material into S/D contact opening 122* followed by a CMP process to substantially coplanarize the top surfaces of S/D contact structure 122, ILD layer 118, and isolation structure 104, as shown in FIGS. 10B and 10D.

The present disclosure provides example isolation structures (e.g., isolation structure 104) between finFETs (e.g., finFETs 101-102) for improving device fabrication process control and example methods for fabricating the same. In some embodiments, the isolation structure can be formed by the dielectric filling of an isolation trench (e.g., isolation trench 104*) with an aspect ratio smaller than that of gate structures and/or a horizontal dimension (e.g., along an X-axis and/or Y-axis) larger than a gate pitch of the gate structures. Such an isolation trench can be formed by removing two or more redundant gate portions (e.g., redundant gate portions 112*) from adjacent gate structures and by removing redundant dielectric layers between the redundant gate portions. The smaller aspect ratios of the isolation trenches help to effectively remove the redundant gate portions from the difficult to etch locations, such as the corners and/or bottom of the isolation trenches with a simplified etching process in terms of the number of operations required, which in turn reduces device manufacturing cost. Thus, the isolation structures with smaller aspect ratios than that of the gate structures can be formed with better CMG process control than isolation structures with aspect ratios and/or horizontal dimensions similar to the gate structures.

The device fabrication process control is further improved by using the single isolation structure to cut multiple long gate structures (e.g., gate structures 112BD-112CE) at the same time. The process of cutting multiple long gate structures at the same time with an isolation structure can eliminate CMG process-related variability along with CMG process-related complexity associated with cutting single gate structures with smaller isolation structures (e.g., length along an X-axis less than a gate pitch). Reducing process-related variability along with process-related complexity across the finFETs (e.g., finFETs 101-102) can reduce the performance variability across the finFETs and device manufacturing cost.

Further, the isolation structure can extend into the substrate 106 and provide electrical isolation between p- and n-well regions under the finFETs. Also, the isolation structure can be used as an etch stop layer during the formation of S/D contact structure (e.g., S/D contact structure 122) to control the height (e.g., height H3) of S/D contact structure and prevent the formation of undesirable parasitic capacitors with adjacent gate structures. Thus, the finFET fabrication process control is further improved by the use of the isolation structure.

In some embodiments, a semiconductor device includes a substrate, first and second fin structures disposed on the substrate, a first pair of gate structures disposed on the first fin structure, and a second pair of gate structures disposed on the second fin structure. The first end surfaces of the first pair of gate structures face second end surfaces of the second pair of gate structure. The first end surfaces of the first pair of gate structures are in physical contact with a first sidewall of the isolation structure and the second end surfaces of the second pair of gate structures are in physical contact with a second sidewall of the isolation structure. The semiconductor device further includes an isolation structure interposed between the first and second pairs of gate structures. An aspect ratio of the isolation structure is smaller than a combined aspect ratio of the first pair of gate structures.

In some embodiments, a semiconductor device includes a substrate, first and second fin structures disposed on the substrate. The first and second fin structures comprise first and second epitaxial regions, respectively. The semiconductor device further includes a first pair of gate structures disposed on the first fin structures and a second pair of gate structures disposed on the second fin structure. The first end surfaces of the first pair of gate structures faces second end surfaces of the second pair of gate structures. The first epitaxial region is interposed between first sidewalls of the first pair of gate structures and the second epitaxial region is interposed between second sidewalls of the second pair of gate structures. The semiconductor device further includes an isolation structure interposed between the first end surfaces of the first pair of gate structures and the second end surfaces of the second pair of gate structures and between the first and second fin structures and a contact structure disposed on the first and second epitaxial regions and the isolation structure. An aspect ratio of the isolation structure is smaller than a combined aspect ratio of the first pair of gate structures.

In some embodiments, a method includes forming first and second gate structures on first and second fin structures disposed on a substrate, forming an isolation trench across the first and second gate structures, and forming an isolation structure within the isolation trench. The isolation trench divides the first gate structure into a first pair of gate structures electrically isolated from each other and divides the second gate structure into a second pair of gate structures electrically isolated from each other. The forming the isolation trench includes forming a first trench portion that extends a first distance into the substrate and forming a second trench portion that extends a second distance into the substrate. The second distance is shorter than the first distance.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a shallow trench isolation (STI) region on a substrate;
    forming first and second gate structures on first and second fin structures disposed on the substrate;
    forming an isolation trench across the first and second gate structures, wherein the isolation trench divides the first gate structure into a first pair of gate structures electrically isolated from each other and divides the second gate structure into a second pair of gate structures electrically isolated from each other, and wherein forming the isolation trench comprises:
        forming a first trench portion with a first bottom edge disposed in the substrate, and
        forming a second trench portion with a second bottom edge disposed in the STI region; and
    forming an isolation structure in the isolation trench.

2. The method of claim 1, wherein forming the isolation trench further comprises:
    performing a first etching process on the first and second gate structures at a first etching rate; and
    performing a second etching process on the first and second gate structures at a second etching rate that is higher than the first etching rate.

3. The method of claim 1, wherein forming the isolation trench comprises:
    etching portions of the first and second gate structures at a first etching rate; and
    etching dielectric layers between the first and second gate structures at a second etching rate that is lower than the first etching rate.

4. The method of claim 1, wherein forming the isolation trench comprises:
    etching portions of the first and second gate structures with a chlorine based etchant gas; and
    etching dielectric layers between the first and second gate structures with a fluorine based etchant gas.

5. The method of claim 1, wherein forming the isolation trench comprises a cyclic etching process, wherein each cycle of the cyclic etching process comprises:
    performing a first etching process on the first and second gate structures with a fluorine based etchant gas at a first etching rate; and
    performing a second etching process on the first and second gate structures with a chlorine based etchant gas at a second etching rate higher than the first etching rate.

6. The method of claim 1, wherein forming the isolation structure comprises depositing a dielectric material in the isolation trench.

7. The method of claim 1, wherein forming the isolation structure comprises:
    depositing a dielectric liner on sidewalls of the isolation trench; and
    depositing a dielectric layer on the dielectric liner to fill the isolation trench.

8. The method of claim 1, further comprising forming a contact structure on the isolation structure and the first and second fin structures, wherein a portion of the contact structure is in the isolation structure.

9. The method of claim 1, further comprising forming a contact structure overlapping the isolation structure.

10. The method of claim 1, further comprising forming a trench in a portion of the isolation structure disposed between the first and second fin structures.

11. A method, comprising:
    forming first and second fin structures on a substrate;
    forming first and second source/drain (S/D) regions on the first and second fin structures, respectively;
    forming first and second gate structures on the first and second fin structures;
    forming an isolation trench across the first and second gate structures and substantially in parallel with the first and second fin structures, wherein forming the isolation trench comprises performing first and second etching processes at different etching rates on the first and second gate structures;
    forming an isolation structure in the isolation trench; and
    forming a shared contact structure on the first and second S/D regions and through the isolation structure.

12. The method of claim 11, wherein performing the first etching process comprises etching the first and second gate structures at a first etching rate, and wherein performing the second etching process comprises etching the first and second gate structures at a second etching rate that is higher than the first etching rate.

13. The method of claim 11, wherein forming the isolation trench comprises:

etching portions of the first and second gate structures at a first etching rate; and etching dielectric layers between the first and second gate structures at a second etching rate that is lower than the first etching rate.

14. The method of claim 11, wherein forming the isolation trench comprises:

etching portions of the first and second gate structures at a first etching rate; and etching dielectric layers between the first and second gate structures at a second etching rate that is higher than the first etching rate.

15. The method of claim 11, wherein forming the shared contact structure on the first and second S/D regions comprises depositing a contact plug in the isolation structure.

16. The method of claim 11, further comprising forming a trench in a portion of the isolation structure disposed between the first and second S/D regions.

17. A method, comprising:

forming fin structures on a substrate;

forming gate structures on the fin structures;

performing first and second etching processes at different etching rates on the gate structures to form a trench across the gate structures and substantially in parallel with the fin structures, wherein the trench comprises a first bottom edge disposed in a shallow trench isolation region and a second bottom edge in the substrate; and depositing a dielectric layer in the trench.

18. The method of claim 17, wherein performing the first etching process comprises etching the gate structures at a first etching rate, and wherein performing the second etching process comprises etching the gate structures at a second etching rate that is higher than the first etching rate.

19. The method of claim 17, wherein performing the first etching process comprises etching the gate structures with a fluorine based etchant gas at a first etching rate, and wherein performing the second etching process comprises etching the gate structures with a chlorine based etchant gas at a second etching rate higher than the first etching rate.

20. The method of claim 17, further comprising depositing a dielectric liner on sidewalls of the trench prior to depositing the dielectric layer.

* * * * *